(12) United States Patent
Shin et al.

(10) Patent No.: US 10,847,076 B2
(45) Date of Patent: Nov. 24, 2020

(54) WIRING SUBSTRATE, DISPLAY DEVICE INCLUDING THE WIRING SUBSTRATE, AND METHOD OF FABRICATING THE WIRING SUBSTRATE

(71) Applicant: Samsung Display Co., Ltd., Yongin-Si (KR)

(72) Inventors: Hyun Eok Shin, Gwacheon-si (KR); Hong Sick Park, Suwon-si (KR); Gyung Min Baek, Yongin-si (KR); Sang Woo Sohn, Yongin-si (KR); Sang Won Shin, Yongin-si (KR); Ju Hyun Lee, Seongnam-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 16/384,821

(22) Filed: Apr. 15, 2019

(65) Prior Publication Data
US 2019/0333435 A1    Oct. 31, 2019

(30) Foreign Application Priority Data

Apr. 26, 2018   (KR) .................. 10-2018-0048507

(51) Int. Cl.
G09G 3/20 (2006.01)
H01L 27/32 (2006.01)
H01L 51/52 (2006.01)

(52) U.S. Cl.
CPC ....... *G09G 3/2003* (2013.01); *H01L 27/3206* (2013.01); *H01L 27/3276* (2013.01); *H01L 51/5237* (2013.01)

(58) Field of Classification Search
None
See application file for complete search history.

(56) References Cited

U.S. PATENT DOCUMENTS

| | | | |
|---|---|---|---|
| 8,928,103 B2* | 1/2015 | Ohba | H01L 27/1462 257/432 |
| 9,519,182 B2 | 12/2016 | Son et al. | |
| 2001/0046107 A1* | 11/2001 | Irie | G11B 5/4806 360/294.4 |
| 2006/0237720 A1* | 10/2006 | Misaki | H01L 27/1214 257/59 |
| 2011/0241027 A1* | 10/2011 | Kaneta | H01L 27/3246 257/88 |
| 2012/0287025 A1* | 11/2012 | Inoue | G09G 3/3233 345/76 |
| 2018/0120623 A1* | 5/2018 | Shiina | G02F 1/13452 |

FOREIGN PATENT DOCUMENTS

| | | |
|---|---|---|
| JP | 2016-103436 A | 6/2016 |
| KR | 10-1447342 B1 | 9/2014 |
| WO | 2016-152581 A1 | 9/2016 |

* cited by examiner

*Primary Examiner* — Christopher J Kohlman
(74) *Attorney, Agent, or Firm* — Innovation Counsel LLP

(57) ABSTRACT

A display device may include a base and a first wiring layer disposed on the base. The first wiring layer may include a first material and a second material layer that overlap each other. A material of the second material layer may be different from a material of the first material layer. The second material layer contains $MoO_x$, wherein $1.9 \leq x \leq 2.1$.

19 Claims, 30 Drawing Sheets

WIRING SUBSTRATE, DISPLAY DEVICE INCLUDING THE WIRING SUBSTRATE, AND METHOD OF FABRICATING THE WIRING SUBSTRATE

This application claims priority to Korean Patent Application No. 10-2018-0048507, filed on Apr. 26, 2018, in the Korean Intellectual Property Office; the disclosure of the Korean Patent Application is incorporated herein by reference in its entirety.

BACKGROUND

1. Field

The technical field relates to a wiring substrate, a display device including the wiring substrate, and a method of fabricating the wiring substrate.

2. Description of the Related Art

A display device typically includes a plurality of pixels for displaying different colors to display a color image. In order for the pixels to display different colors, a wiring substrate of the display device may include signal wires for transmitting driving signals to the pixels. The signal wires are not only required to have a low electric resistance to minimize loss of the driving signals, but also required to have high thermal stability and excellent processability. However, signal wires comprising a metal material may have a significantly high light reflectance, and external light reflected by such signal wires may degrade display quality, such as contrast, of displayed images.

SUMMARY

Embodiments may be related to a display device capable of providing an improved display quality by suppressing the reflection of external light.

Embodiments may be related to a wiring substrate capable of suppressing the reflection of external light.

Embodiments may be related to a method of fabricating a wiring substrate capable of suppressing the reflection of external light.

However, embodiments are not restricted to those set forth herein. The above and other embodiments will become more apparent to one of ordinary skill in the art to which the present disclosure pertains by referencing the detailed description given below.

According to an embodiment, a display device comprising: a base; and a first wiring layer disposed on the base and including first and second material layers that are stacked, the second material layer containing a different material from the first material layer, wherein the second material layer contains $MoO_x$ ($1.9 \leq x \leq 2.1$).

In an embodiment, the light reflectance of the first material layer is higher than the light reflectance of the second material layer.

In an embodiment, the first and second material layers are in contact with each other, and a thickness of the first material layer is greater than a thickness of the second material layer, and the thickness of the second material layer is 400 Å or greater.

In an embodiment, the first wiring layer further includes a third material layer spaced apart from the second material layer with the first material layer interposed therebetween and in contact with the first material layer, and the electrical conductivity of the first material layer is higher than the electrical conductivity of the second material layer and is also higher than the electrical conductivity of the third material layer.

In an embodiment, the first wiring layer further includes a third material layer spaced apart from the second material layer with the first material layer interposed therebetween and in contact with the first material layer, the first and second material layers are in contact with each other, a thickness of the first material layer is greater than a thickness of the third material layer, and a thickness of the second material layer is greater than the thickness of the third material layer.

In an embodiment, the second material layer includes a first portion containing the $MoO_x$ and in contact with the first material layer, and a second portion disposed on the first portion, having no physical boundary with the first portion, and containing $MoO_y$ ($x<y$).

In an embodiment, the first portion contains amorphous molybdenum oxide and consists only of molybdenum (Mo) atoms and oxygen (O) atoms.

In an embodiment, the second portion contains amorphous molybdenum oxide and consists only of Mo atoms and O atoms, and y is 2.9 to 3.1.

In an embodiment, a thickness of the first portion is greater than a thickness of the second portion.

In an embodiment, the display device further comprising: a passivation layer disposed on the first wiring layer and partially in contact with the second portion; and a pixel electrode disposed on the passivation layer, wherein the second portion and the passivation layer have a contact hole, and the pixel electrode is in contact with the first portion.

In an embodiment, the specific resistance of the first portion is $10^{-4}$ Ωm or less.

In an embodiment, the display device further comprising: a second wiring layer disposed between the base and the first wiring layer, insulated from the first wiring layer, and including fourth and fifth material layers that are stacked; and a semiconductor material layer disposed between the first and second wiring layers, wherein the fourth material layer contains the same material as the first material layer, and the fifth material layer contains the same material as the second material layer.

In an embodiment, sides of the second material layer form a first inclination angle, sides of the fifth material layer form a second inclination angle, which is smaller than the first inclination angle, and sides of the semiconductor material layer form a third inclination angle, which is greater than the first inclination angle.

In an embodiment, the first wiring layer includes a data line, a source member, and a drain member, the second wiring layer includes a gate line and a gate member, and the gate member, the semiconductor material layer (member), the source member, and the drain member form a thin-film transistor (TFT).

According to an embodiment a wiring substrate comprising: a base; and a first wiring layer disposed on the base and including first and second material layers that are stacked, the second material layer containing a different material from the first material layer, wherein the second material layer contains $MoO_x$ ($1.9 \leq x \leq 2.1$).

According to an embodiment a method of fabricating a wiring substrate, comprising: sequentially forming a first metal layer and a second metal layer, which contains a different material from the first metal layer, on a base; forming a mask material on the second metal layer; and forming first and second material layers that are stacked, by etching the first and second metal layers in a batch manner, wherein the second material layer contains $MoO_x$ ($1.9 \leq x \leq 2.1$).

In an embodiment, the method of fabricating a wiring substrate further comprising, between the forming the second metal layer and the forming the mask material: partially oxidizing the second metal layer.

In an embodiment, the partially oxidizing the second metal layer, comprises forming first and second portions having different Mo:O composition ratios, the first portion contains the $MoO_x$, the second portion has no physical boundary with the first portion and contains $MoO_y$ ($x<y$).

In an embodiment, the method of fabricating a wiring substrate further comprising, after the forming the first and second portions, exposing the first portion by partially removing the second portion.

In an embodiment, the forming the second metal layer, comprises forming the second metal layer through sputtering, the sputtering is performed in an inert gas atmosphere, a target of the sputtering contains molybdenum oxide, and the Mo:O composition ratio of the molybdenum oxide contained in the target is 1:1.9 to 1:2.1.

In an embodiment, the forming the first and second material layers, comprises etching the first and second metal layers in a batch manner using an etchant, and the etchant contains 10.0 wt % to 20.0 wt % peroxosulfate.

An embodiment may be related to a display device. The display device may include a base and a first wiring layer disposed on the base. The first wiring layer may include a first material and a second material layer that overlap each other. A material of the second material layer may be different from a material of the first material layer. The second material layer may contain $MoO_x$, wherein $1.9 \leq x \leq 2.1$.

The light reflectance of the first material layer may be higher than the light reflectance of the second material layer.

The first material layer and the second material layer may directly contact each other. A thickness of the first material layer in a direction perpendicular to the base may be greater than a thickness of the second material layer in the direction. The thickness of the second material layer may be 400 Å or greater.

The first wiring layer further may include a third material layer spaced from the second material layer and may directly contacting the first material layer. The first material layer may be interposed between the third material layer and the second material layer. The electrical conductivity of the first material layer may be higher than the electrical conductivity of the second material layer and may be higher than the electrical conductivity of the third material layer.

The first wiring layer further may include a third material layer spaced from the second material layer and directly contacting the first material layer. The first material layer may be interposed between the third material layer and the second material layer. The first material layer and the second material layer may directly contact each other. A thickness of the first material layer in a direction perpendicular to the base may be greater than a thickness of the third material layer in the direction. A thickness of the second material layer in the direction may be greater than the thickness of the third material layer.

The second material layer may include a first portion and a second portion. The first portion contains the $MoO_x$ and may directly contact the first material layer. The second portion may be disposed on the first portion and may contain $MoO_y$, wherein $x<y$. The $MoO_y$ and the $MoO_x$ may be connected to each other through chemical bonds.

The first portion may contain first amorphous molybdenum oxide and may consist of only molybdenum atoms and oxygen atoms.

The second portion may contain second amorphous molybdenum oxide and may consist of only Mo atoms and O atoms, wherein y may be in a range of 2.9 to 3.1.

A thickness of the first portion in a direction perpendicular to the base may be greater than a thickness of the second portion in the direction.

The display device may include a passivation layer and a pixel electrode. The passivation layer may be disposed on the first wiring layer and may directly contact the second portion. The pixel electrode may be disposed on the passivation layer. The second portion and the passivation layer may have a contact hole. The pixel electrode may directly contact the first portion through the contact hole.

The specific resistance of the first portion may be $10^{-4}$ Ωm or less.

The display device may include a second wiring layer and a semiconductor material layer. The second wiring layer may be disposed between the base and the first wiring layer, insulated from the first wiring layer, and including a fourth material layer and a fifth material layer that overlap each other. The semiconductor material layer may be disposed between the first wiring layer and the second wiring layer. The fourth material layer may contain the same material as the first material layer. The fifth material layer may contain the same material as the second material layer.

Sides of the second material layer may form a first acute angle. Sides of the fifth material layer may form a second acute angle, which may be smaller than the first acute angle. Sides of the semiconductor material layer may form a third acute angle, which may be greater than the first acute angle.

The first wiring layer may include a data line, a source member, and a drain member. The second wiring layer may include a gate line and a gate member. The gate member, the semiconductor material layer, the source member, and the drain member may form a thin-film transistor.

An embodiment may be related to a wiring substrate. The wiring substrate may include a base and a first wiring layer disposed on the base. The first wiring layer may include a first material layer and a second material layer that overlap each other. A material of the second material layer may be different from a material of the first material layer. The second material layer may contain $MoO_x$, wherein $1.9 \leq x \leq 2.1$.

An embodiment may be related to a method of fabricating a wiring substrate. The method may include the following steps: sequentially forming a first layer and a second layer on a base, wherein a material of the second layer may be different from a material of the first layer; forming a mask on the second layer; and forming a first material layer and a second material layer by etching the first layer and the second layer using the mask, wherein the second material layer contains $MoO_x$, and wherein $1.9 \leq x \leq 2.1$.

The method may include the following step: between the forming the second layer and the forming the mask, partially oxidizing the second layer.

The partially oxidizing the second layer may produce a first portion and a second portion. The first portion may contain the $MoO_x$. The second portion may contain $MoO_y$ that has chemical bonds with the $MoO_x$, wherein $x<y$. The method may include the following step: after the forming the first portion and the second portion, exposing the first portion by partially removing the second portion.

The second layer may be formed through sputtering. The sputtering may be performed in an inert gas atmosphere. A target of the sputtering may contain molybdenum oxide. The Mo:O composition ratio of the molybdenum oxide contained in the target may be in a range of 1:1.9 to 1:2.1.

The etching the first layer and the second metal layer may be performed using an etchant. The concentration of peroxosulfate in the etchant may be in a range of 10.0 wt % to 20.0 wt %.

According to embodiments, reflection of external light by a wiring substrate can be minimized, and a display device with satisfactory display quality can be provided.

DETAILED DESCRIPTION

Example embodiments are described with reference to the accompanying drawings. Practical embodiments may be embodied in many different forms and should not be construed as being limited to the embodiments set forth herein.

Although the terms "first," "second," etc. may be used herein to describe various elements, these elements, should not be limited by these terms. These terms may be used to distinguish one element from another element. Thus, a first element may be termed a second element without departing from teachings of one or more embodiments. The description of an element as a "first" element may not require or imply the presence of a second element or other elements. The terms "first," "second," etc. may also be used herein to differentiate different categories or sets of elements. For conciseness, the terms "first," "second," etc. may represent "first-type (or first-set)," "second-type (or second-set)," etc., respectively.

When a first element is referred to as being "on," "connected to," or "coupled to" a second element, the first element can be directly on, directly connected to, or directly coupled to the second element, or one or more intervening elements may be present between the first element and the second element. When a first element is referred to as being "directly on," "directly connected to," or "directly coupled to" a second element, there are no intended intervening elements (except environmental elements such as air) present between the first element and the second element. The term "connect" may mean "electrically connect"; the term "insulate" may mean "electrically insulate"; the term "opposing" may mean "opposite"; the term "contact" may mean "direct contact" or "directly contact."

Like numbers may refer to like elements.

The term "and/or" may mean inclusion of any and all combinations of one or more of the associated listed items.

Spatially relative terms, such as "below," "lower," "under," "above," "upper," and the like, may be used herein for ease of description to describe the relationship of one element to another element(s) illustrated in the figures. The spatially relative terms may encompass different orientations of the device in use or operation, in addition to the orientation depicted in the figures. For example, if the device in the figures is turned over, elements described as "below" or "beneath" relative to other elements or features would then be oriented "above" relative to the other elements or features. Thus, the term "below" can encompass both an orientation of above and below.

A first direction/axis X may refer to an arbitrary direction in a plane, a second direction/axis Y may refer to a direction intersecting the first direction X in the plane, and a third direction/axis Z may refer to a direction perpendicular to the plane.

Figure 1:
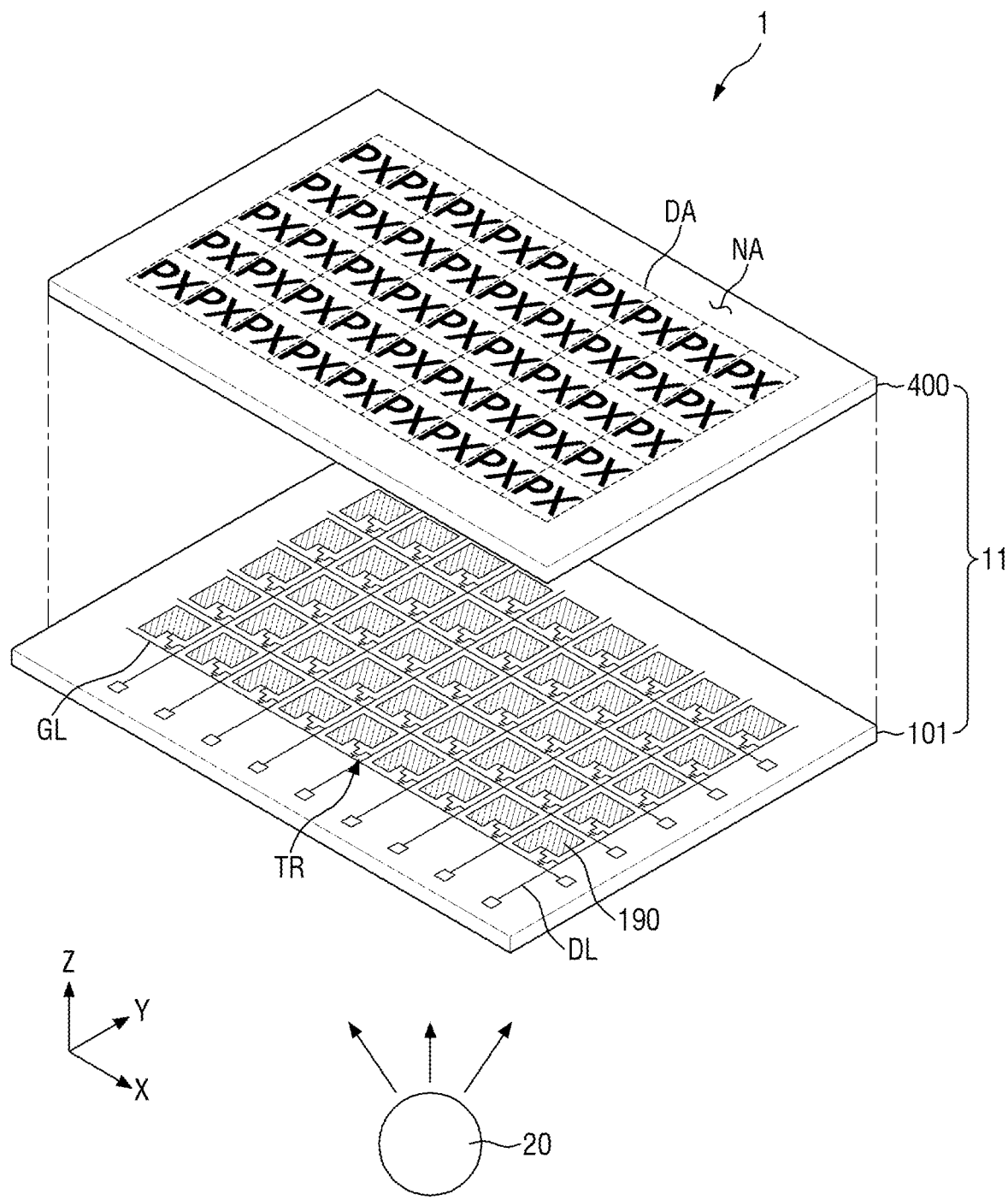
FIG. 1 is an exploded perspective view of a display device according to an embodiment.

FIG. 1 is an exploded perspective view of a display device according to an embodiment.

Referring to FIG. 1, a display device 1 may include a display panel 11 and a backlight unit 20 providing light to the display panel 11.

A display area DA and a non-display area NA may be defined on the display panel 11. The display area DA includes a plurality of pixels PX and contributes to the display of an actual image. The term "pixel" may refer to a region that can display a predetermined primary color. Examples of the primary color include red, green, and blue colors. FIG. 1 illustrates the pixels PX as being arranged in the first and second directions X and Y, substantially in a matrix form. In a plan view, the display area DA may be surrounded by the non-display area NA. The non-display area NA may be an area that does not contribute to the display of an image.

The display panel 11 may include a plurality of gate lines GL extending substantially in the first direction X and a plurality of data lines DL extending substantially in the second direction Y. The gate lines GL may be disposed in the display area DA, may cross a boundary between the display area DA and the non-display area NA, and may transmit gate signals provided by a gate driver to thin-film transistors (TFTs) TR in the display area DA. The data lines DL may also be disposed in the display area DA, may cross a boundary between the display area DA and the non-display area NA, and may transmit data signals provided by a data driver to the TFTs TR in the display area DA.

The backlight unit 20 may be disposed below the display panel 11. The backlight unit 20 may provide light of a particular wavelength to the display panel 11. In one embodiment, the backlight unit 20 may be an edge-type backlight unit including a light source (not illustrated) and a light guide plate (not illustrated), which guides light provided by the light source so as for the light to be emitted toward the display panel 11. The light source may include a light-emitting diode (LED) or an organic LED (OLED). The light source may emit blue light or white light. The material of the light guide plate may have a high light transmittance. For example, the light guide plate may comprise a glass material, a quartz material, or a plastic material such as polyethylene terephthalate (PET) or polycarbonate (PC). In an embodiment, the backlight unit 20 may be a direct-type backlight unit in which the light source overlaps the display panel 11.

Although not specifically illustrated, one or more optical sheets (not illustrated) may be disposed between the display panel 11 and the backlight unit 20. The optical sheets may include at least one of a prism sheet, a diffusion sheet, a (reflective) polarizing sheet, a lenticular lens sheet, and a micro-lens sheet. The optical sheets can improve the display quality of the display device 1 by modulating the optical characteristics of light traveling from the backlight unit 20 toward the display panel 11. For example, the optical sheets can condense or diffuse/scatter light, or can modulate the polarization characteristics of light.

Figure 2:
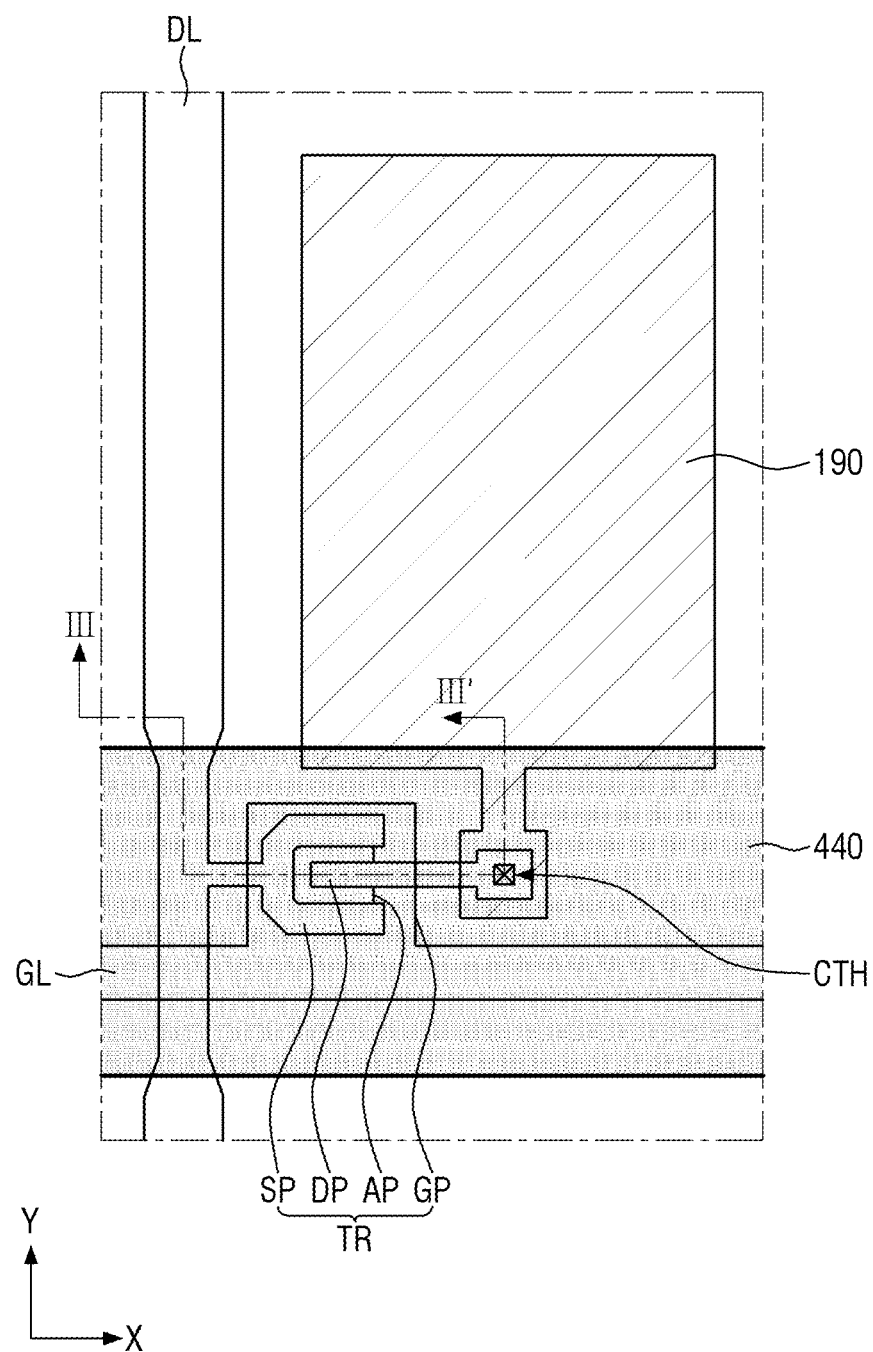
FIG. 2 is a layout view of a pixel of the display device of FIG. 1.
Figure 3:
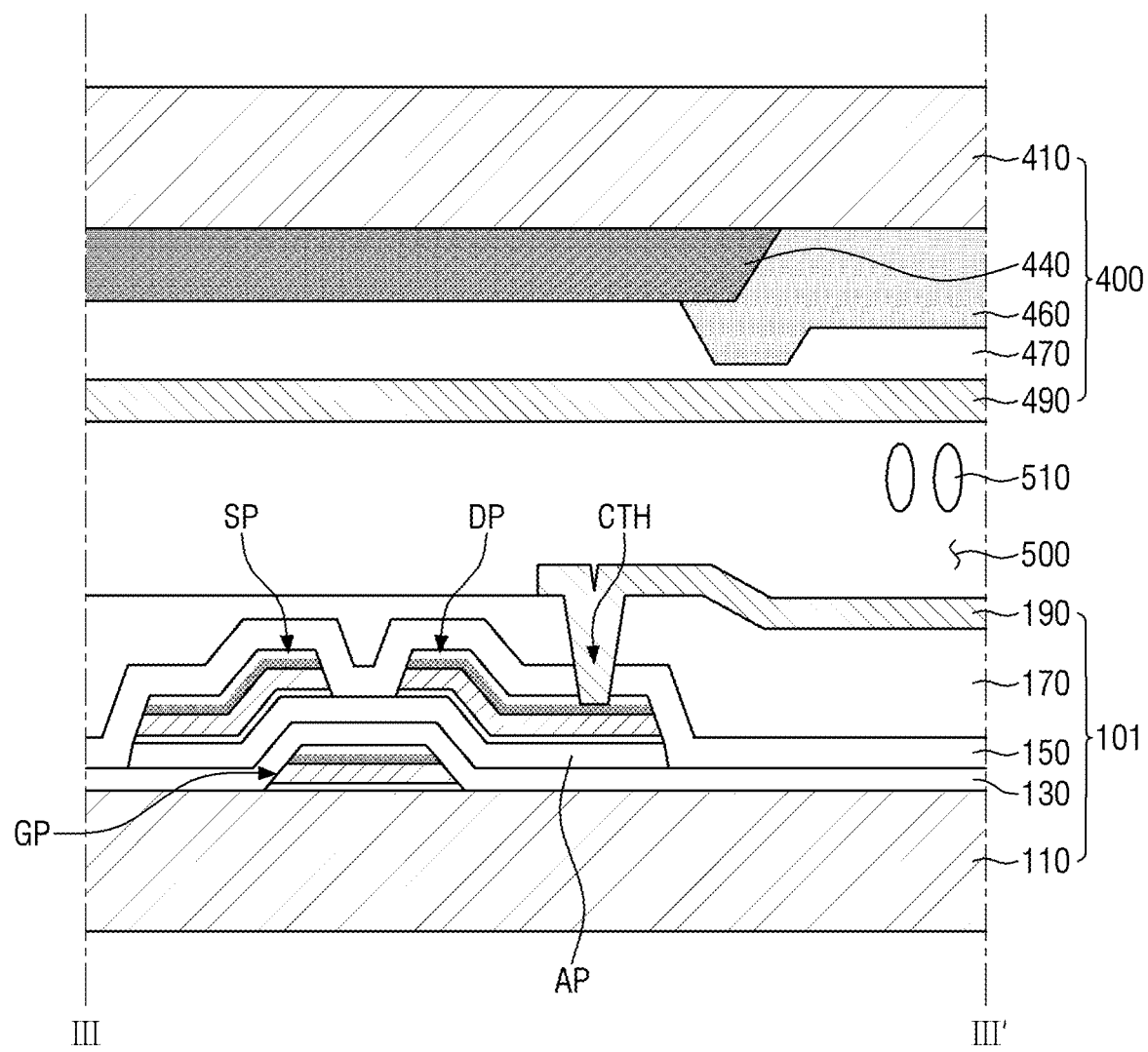
FIG. 3 is a cross-sectional view taken along line III-III' of FIG. 2.
Figure 4:
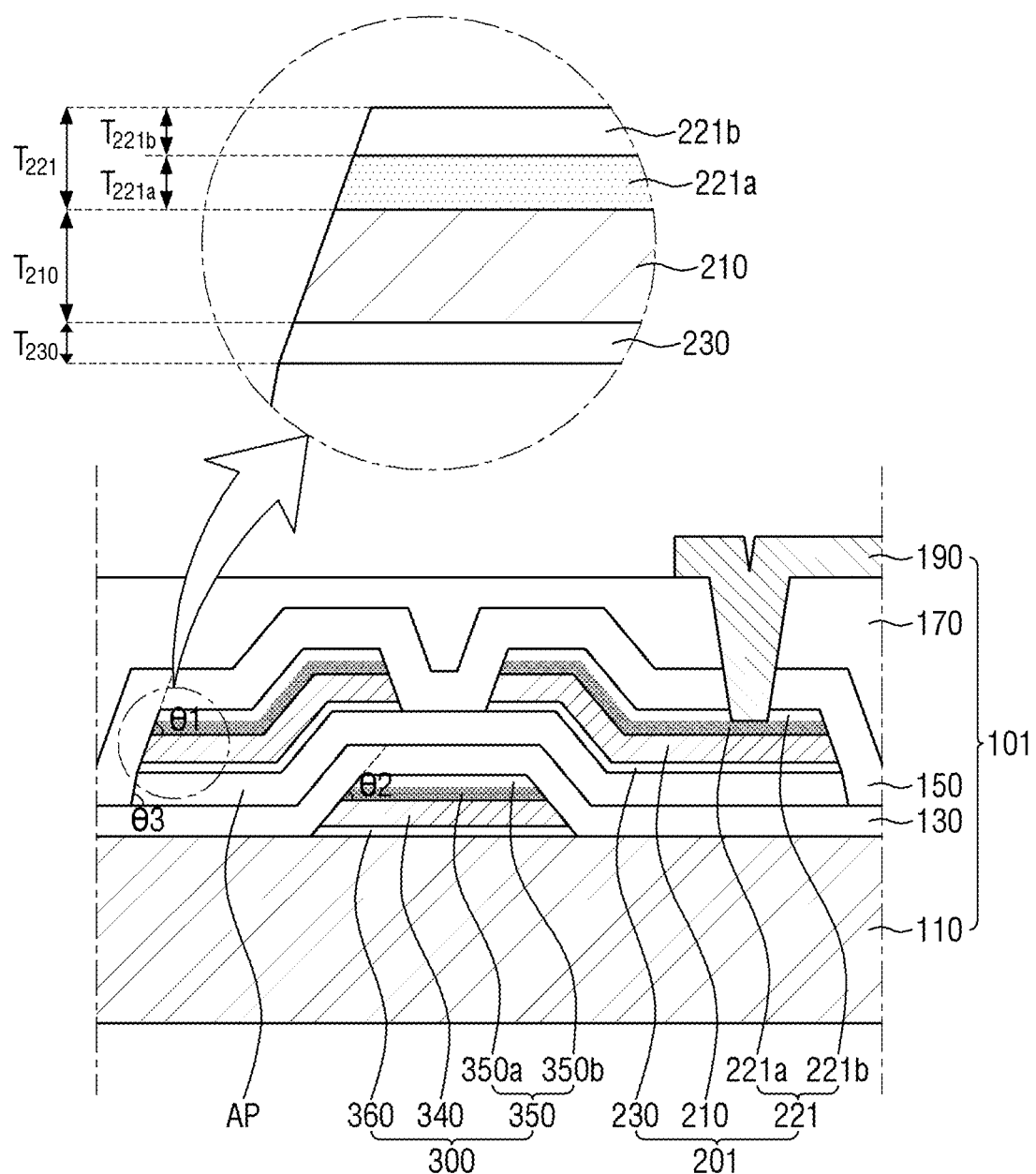
FIG. 4 is an enlarged cross-sectional view showing a portion of a wiring substrate illustrated in FIG. 3.

FIG. 2 is a layout view of an arbitrary pixel of the display device of FIG. 1. FIG. 3 is a cross-sectional view taken along line III-III' of FIG. 2. FIG. 4 is an enlarged cross-sectional view illustrating a portion of a wiring substrate illustrated in FIG. 3.

Referring to FIGS. 2 through 4, the display panel 11 may include a wiring substrate 101 (for example, a lower substrate), an opposing substrate 400 (for example, an upper substrate), and a liquid crystal layer 500 interposed between the wiring substrate 101 and the opposing substrate 400. Although not specifically illustrated, the wiring substrate 101 and the opposing substrate 400 may be coupled to each other by a sealing member (not illustrated).

The wiring substrate 101 may include a lower base 110 and a first wiring layer 201 disposed on the lower base 110 and may further include a semiconductor material layer AP, a second wiring layer 300, and a pixel electrode 190. The first wiring layer 201 may be a data wiring layer including a data line DL, a source member SP (or source electrode SP), and a drain member DP (or drain electrode DP), and the second wiring layer 300 may be a gate wiring layer including a gate line GL and a gate member GP (or gate electrode GP).

The lower base 110 may be a transparent insulating plate or a transparent insulating film. For example, the lower base 110 may comprise a glass material, a quartz material, or a light-transmitting plastic material. In some embodiments, the lower base 110 may already be bent, and the display device 1 may be a curved display device. The top surface of the lower base 110 may be in or parallel to the plane where the first and second directions X and Y belong.

The second wiring layer 300 may be disposed on the lower base 110. The second wiring layer 300 may include the gate line GL and the gate member GP. The gate line GL and the gate member GP may be disposed in the same layer and may be formed at substantially the same time by a single process.

The gate line GL may extend substantially in the first direction X. The gate line GL may transmit a gate signal provided by a gate driver (not illustrated) to a TFT TR in a pixel PX. The gate signal may be a control signal for the TFT TR. For example, a plurality of pixels PX arranged along the first direction X may share the same gate line GL.

The gate member GP may be electrically connected to the gate line GL and may thus be provided with the gate signal. For example, a part of the gate line GL may protrude to form the gate member GP, and the gate line GL and the gate member GP may be two portions of the same conductive member. The gate member GP may be a control terminal of the TFT TR.

The second wiring layer 300 may have a stack of multiple layers. In one embodiment, the second wiring layer 300 may include fourth and fifth material layers 340 and 350 that are stacked, and may further include a sixth material layer 360.

A gate insulating layer 130 may be disposed on the second wiring layer 300. The gate insulating layer 130 may insulate the first wiring layer 201 from elements disposed on the first wiring layer 201. The gate insulating layer 130 may comprise an inorganic insulating material such as silicon nitride, silicon oxide, silicon oxynitride, or silicon nitrogen oxide. The gate insulating layer 130 may have a multilayer structure or a single-layer structure.

The semiconductor material layer AP may be disposed on the gate insulating layer 130. The semiconductor material layer AP may comprise a semiconductor material. For example, the semiconductor material layer AP may comprise amorphous silicon. In another example, the semiconductor material layer AP may comprise polycrystalline silicon, monocrystalline silicon, or an oxide semiconductor material. The semiconductor material layer AP may form/provide a channel of the TFT TR. For example, a channel may be formed in the semiconductor material layer AP in accordance with the gate signal applied to the gate member GP. The semiconductor material layer AP may overlap the first wiring layer 201 and may include a portion positioned between the source member SP and the drain member DP.

The first wiring layer 201 may be disposed on the semiconductor material layer AP. The first wiring layer 201 may be insulated from the second wiring layer 300. The first wiring layer 201 may include the data line DL, the source member SP, and the drain member DP. The data line DL, the source member SP, and the drain member DP may be disposed in the same layer and may be formed at substantially the same time by a single process.

The data line DL may extend substantially in the second direction Y. The data line DL may transmit a data signal provided by a data driver (not illustrated) to the TFT TR in a pixel PX. The data signal may be an input signal for the TFT TR. For example, a plurality of pixels PX arranged along the second direction Y may share the same data line DL.

The source member SP may be electrically connected to the data line DL and may thus be provided with the data signal. For example, a part of the data line DL may protrude to form the source member SP, and the data line DL and the source member SP may be two portions of the same conductive member. In a plan view, the source member SP may surround at least part of the drain member DP. Also, the drain member DP may be spaced apart from the data line DL over the semiconductor material layer AP. The drain member DP may be electrically connected to the pixel electrode 190. The source member SP and the drain member DP may be an input terminal and an output terminal, respectively, of the TFT TR. A signal provided to the source member SP, for example, a current signal, may be transmitted to the drain member DP via the channel formed in the semiconductor member layer AP.

The first wiring layer 201 may have a stack of multiple layers. In one embodiment, the first wiring layer 201 may include first and second material layers 210 and 221 that are stacked, and may further include a third material layer 230.

The first material layer 210 may comprise a metal material having a low specific resistance and excellent electrical conductivity. For example, the first material layer 210 may comprise copper (Cu), silver (Ag), aluminum (Al), or an alloy. The first material layer 210 may have a single-layer structure. In an example, the first material layer 210 may be a Cu single layer formed of pure Cu or a Cu alloy single layer comprising a Cu alloy. The first material layer 210 may be opaque.

The second material layer 221 may be disposed on the first material layer 210. For example, the second material layer 221 may be in contact with the top surface of the first material layer 210. The second material layer 221 may comprise a material having a higher light absorptivity and lower light reflectance than the first material layer 210. For example, the second material layer 221 may have a lower average reflectance than the first material layer 210 for the entire wavelength band of visible light.

In one embodiment, the second material layer 221 may comprise molybdenum oxide ($MoO_x$). The second material layer 221 may include a first portion 221a and a second portion 221b disposed on the first portion 221a.

The first portion 221a may be in contact with the first material layer 210. For example, the first portion 221a may have a predetermined thickness from the bottom surface of the second material layer 221. The first portion 221a may comprise amorphous molybdenum oxide. In one embodiment, the first portion 221a may comprise $MoO_x$ (1.9≤x≤2.1). The first portion 221a may generally have a substantially uniform composition ratio. For example, the first portion 221a may consist of only molybdenum (Mo) atoms and oxygen (O) atoms, and the Mo:O composition ratio of the first portion 221a may be in a range of about 1:1.9 to about 1:2.1, in a range of about 1:1.95 to about 1:2.05, or about 1:2.0. The extinction coefficient (k) of the first portion 221a for the entire wavelength band of visible light may be about 0.7 or greater.

The second portion 221b may be disposed on the first portion 221a. The second portion 221b may protect the first portion 221a so as for the first portion 221a to maintain a predetermined extinction coefficient and may thus protect the reliability of the display device 1. Also, the second portion 221b may prevent the first portion 221a from being in contact with a passivation layer 150.

The second portion 221b may be in contact with the passivation layer 150. For example, the second portion 221b may be a part of the second material layer 221 having a predetermined thickness from the top surface of the second material layer 221. The second portion 221b, like the first portion 221a, may comprise amorphous molybdenum oxide.

The second portion 221b may generally have a substantially uniform composition ratio. The second portion 221b may have a greater oxygen content than the first portion 221a. In one embodiment, the second portion 221b may comprise $MoO_y$ (x<y). For example, the second portion 221b may consist of only Mo atoms and O atoms, and the Mo:O composition ratio of the second portion 221b may be in a range of about 1:2.9 to about 1:3.1 (i.e., y is 2.9 to 3.1), in a range of about 1:2.95 to about 1:3.05 (i.e., y is 2.95 to 3.05), or about 1:3.0 (i.e., y is 3.0). The extinction coefficient (k) of the second portion 221b for the entire wavelength band of visible light may be smaller than the extinction coefficient (k) of the first portion 221a for the entire wavelength band of visible light.

The first and second portions 221a and 221b of the second material layer 221 may be two directly connected and/or integrated portions of the second material layer 221. The first portion 221a comprising amorphous molybdenum oxide and the second portion 221b comprising amorphous molybdenum oxide may have different composition ratios, but the molybdenum oxide of the first portion 221a and the molybdenum oxide of the second portion 221b may form chemical bonds and may connect with each other through the chemical bonds. The second portion 221b may be formed by partially oxidizing the molybdenum oxide of the first portion 221a. FIGS. 3 and 4 illustrate the first portion 221a as being disposed directly on the second portion 221b. In an embodiment, a portion (not illustrated) comprising amorphous molybdenum oxide having a composition ratio different from the composition ratio of the molybdenum oxide of the first portion 221a and different from the composition ratio of the molybdenum oxide of the second portion 221b may be provided between the first and second portions 221a and 221b. The portion further disposed between the first and second portions 221a and 221b may have chemical bonds with each of the first and second portions 221a and 221b. In an embodiment, the second portion 221b may have a greater oxygen content than the first portion 221a, and the oxygen content of the second material layer 221 may gradually or incrementally vary from the second portion 221b to the first portion 221a.

A thickness $T_{221a}$ of the first portion 221a, which has a Mo:O composition ratio in a range of about 1:1.9 to about 1:2.1 and generally has a uniform composition ratio, and a thickness $T_{221b}$ of the second portion 221b, which has a Mo:O composition ratio in a range of about 1:2.9 to about 1:3.1 and generally has a uniform composition ratio, may differ from each other. For example, the thickness $T_{221a}$ of the first portion 221a may be greater than the thickness $T_{221b}$ of the second portion 221b. Accordingly, the second material layer 221 can generally have excellent light absorptivity and low light reflectance, and can generally have improved electrical conductivity. The thicknesses are in the third direction Z, i.e., in a direction perpendicular to the base 110.

The electrical conductivity of the second material layer 221 including the first and second portions 221a and 221b may be lower than the electrical conductivity of the first material layer 210. The electrical conductivity of the second material layer 221 including the first and second portions 221a and 221b may be lower than the electrical conductivity of the third material layer 230. The electrical conductivity of the first portion 221a may be higher than the electrical conductivity of the second portion 221b. In an example, the specific resistance of the first portion 221a may be about $10^{-4}$ Ωm or lower.

A thickness $T_{221}$ of the second material layer 221 including the first and second portions 221a and 221b may be smaller than a thickness $T_{220}$ of the first material layer 210. The thickness $T_{221}$ of the second material layer 221 may be greater than a thickness $T_{230}$ of the third material layer 230. For example, the lower limit of the maximum thickness $T_{221}$ of the second material layer 221 may be about 400 Å or greater, or about 600 Å or greater. In this example, the second material layer 221 can have remarkably low light reflectance for the entire wavelength band of visible light. For example, the upper limit of the maximum thickness $T_{221}$ of the second material layer 221 may be about 1,000 Å or less. In an example, the light reflectance of the second material layer 221 can be further lowered because light reflected from the top surface of the second material layer 221 and light reflected from the top surface of the first material layer 210 can offset each other.

In one embodiment, a contact hole CTH may be formed in the second portion 221b of the second material layer 221. That is, the first portion 221a of the second material layer 221 may be exposed by partially removing the second portion 221b of the second material layer 221. The pixel electrode 190 may be inserted in the contact hole CTH and may directly contact the first portion 221a.

In an embodiment where the electrical conductivity of the first portion 221a of the second material layer 221 is higher than the second portion 221b of the second material layer 221, the contact resistance between the pixel electrode 190 and the first wiring layer 2012 can be lowered by partially removing the second portion 221b so that the pixel electrode 190 can be in contact with the first portion 221a. For example, loss of signals applied to the pixel electrode 190 can be prevented by setting the specific resistance of the conductor in contact with the pixel electrode 190, i.e., the first portion 221a, to be about $10^{-4}$ Ωm or less.

In some embodiments, the first wiring layer 201 may include the third material layer 230 disposed between the semiconductor material layer AP and the first material layer 210. The third material layer 230 may be in contact with the semiconductor material layer AP and the first material layer 210. The third material layer 230 may be a barrier layer preventing the diffusion of metal ions in the first material layer 210 of the first wiring layer 201 into the semiconductor material layer AP. The electrical conductivity of the third material layer 230 may be lower than the electrical conductivity of the first material layer 210. For example, the third material layer 230 may comprise titanium (Ti) or a Ti alloy. The third material layer 230 may have a single-layer structure. In an example, the third material layer 230 may be a Ti single layer formed of pure Ti or a Ti alloy single layer comprising a Ti alloy. The third material layer 230 may be opaque.

The thickness $T_{230}$ of the third material layer 230 may be smaller than the thickness $T_{210}$ of the first material layer 210. Also, the thickness $T_{230}$ of the third material layer 230 may be smaller than the thickness $T_{221}$ of the second material layer 221. By forming the third material layer 230 to have a smaller thickness than the first and second material layers 210 and 221, the thickness of the whole first wiring layer 201 can be reduced, and the general electrical conductivity of the first wiring layer 201 can be improved.

The second wiring layer 300 may include the fourth and fifth material layers 340 and 350 that are stacked, and may further include the sixth material layer 360.

The fourth material layer 340 may comprise a metal material having a low specific resistance and excellent electrical conductivity. The fourth material layer 340 may comprise substantially the same material as the first material layer 210. That is, the fourth material layer 340 may comprise Cu, Ag, Al, or an alloy and may have a single-layer structure. The fourth material layer 340 may be opaque. The fourth material layer 340 may be substantially identical to or analogous to the first material layer 210.

The fifth material layer 350 may be disposed on the fourth material layer 340. For example, the fifth material layer 350 may be in contact with the top surface of the fourth material layer 340. The fifth material layer 350 may comprise substantially the same material, element(s), and/or structure(s) as the second material layer 221. In one embodiment, the fifth material layer 350 may comprise molybdenum oxide. The fifth material layer 350 may include a third portion 350a and a fourth portion 350b disposed on the third portion 350a.

The third portion 350a of the fifth material layer 350 may be in contact with the fourth material layer 340. For example, the third portion 350a may be a portion having a predetermined thickness from the bottom surface of the fifth material layer 350. The third portion 350a may comprise substantially the same material as the first portion 221a. For example, the third portion 350a may comprise amorphous $MoO_x$ (1.9≤x≤2.1) and may generally have a substantially uniform composition ratio. The third portion 350a may be substantially identical to or analogous to the first portion 221a.

The fourth portion 350b of the fifth material layer 350 may be in contact with the passivation layer 150. For example, the fourth portion 350b may be a portion having a predetermined thickness from the top surface of the fifth material layer 350. The fourth portion 350b may comprise substantially the same material, element(s), and/or structure(s) as the second portion 221b. For example, the fourth portion 350b may comprise amorphous $MoO_y$ (x<y) and may generally have a substantially uniform composition ratio. The fourth portion 350b may be substantially identical to or analogous to the second portion 221b.

The third and fourth portions 350a and 350b of the fifth material layer 350 may have be two portions of the same layer 350. The third portion 350a comprising amorphous molybdenum oxide and the fourth portion 350b comprising amorphous molybdenum oxide may have different composition ratios, but the molybdenum oxide of the third portion 350a and the molybdenum oxide of the fourth portion 350b may form chemical bonds and may connect to each other through the chemical bonds. The fourth portion 350b may be formed by partially oxidizing the molybdenum oxide of the third portion 350a. FIGS. 3 and 4 illustrate the fourth portion 350b as being disposed directly on the third portion 350a. In an embodiment, another molybdenum oxide portion (not illustrated) may be provided between the third and fourth portions 350a and 350b. In an embodiment, the oxygen content of the fifth material layer 350 may gradually or incrementally vary from the fourth portion 350b to the third portion 350a.

The fifth material layer 350 may be substantially identical to or analogous to the second material layer 221.

In some embodiments, the second wiring layer 300 may include the sixth material layer 360 disposed between the lower base 110 and the fourth material layer 340. The sixth material layer 360 may be in contact with the lower base 110 and the fourth material layer 340. The sixth material layer 360 may comprise a material with excellent adhesion to the lower base 110. The sixth material layer 360 may comprise a refractive metal with excellent processability. The term "refractive metal" refers to a metal or a metal alloy having a melting point of 1500° C. or higher. Examples of the refractive metal include niobium (Nb), vanadium (V), tantalum (Ta), Ti, zirconium (Zr), hafnium (Hf), Mo, rhenium (Re), and tungsten (W). The electrical conductivity of the sixth material layer 360 may be lower than the electrical conductivity of the fourth material layer 340. In an example, the sixth material layer 360 may have a single-layer structure and may be opaque. The thickness of the sixth material layer 360 may be smaller than the thickness of the fifth material layer 350.

An acute angle formed by two abutting sides of the first wiring layer 201, an acute angle formed by two abutting sides of the second wiring layer 300, and an acute angle formed by two abutting sides of the semiconductor material layer AP may be unequal to one another.

In one embodiments, two abutting sides of the first wiring layer 201, particularly, two abutting sides of the second material layer 221 of the first wiring layer 201, may form a first acute angle θ1, and two abutting sides of the second wiring layer 300, particularly, two abutting sides of the fifth material layer 350 of the second wiring layer 300, may form a second acute angle θ2, which is smaller than the first inclination angle θ1. In some embodiments, the upper limit of the first acute angle θ1 may be about 60°, about 55°, or about 50°, and the upper limit of the second acute angle Q may be about 70°, about 65°, or about 60°, or about 55°. Since the sides of the second wiring layer 300 including the fifth material layer 350 form a relatively small acute angle, coverage defects that may occur in the gate insulating layer 130, the first wiring layer 201, and the passivation layer 150 that are all disposed above the second wiring layer 300 can be prevented.

A third acute angle θ3 formed by two abutting sides of the semiconductor material layer AP may be greater than the first and second acute angles θ1 and θ2. Since the sides of the semiconductor material layer AP form a relatively large acute angle, the characteristics of the TFT TR including the semiconductor material layer AP can be improved.

The first, second, and third acute angles θ1, θ2, and θ3 may be tuned by changing etching conditions during the patterning/formation of the first wiring layer 201, the second wiring layer 300, and the semiconductor material layer AP.

The passivation layer 150 may be disposed on the first wiring layer 201. The passivation layer 150 may be disposed in both the display area DA and the non-display area NA.

The passivation layer 150 may prevent the first wiring layer 201 and the semiconductor material layer AP from being in direct contact with an organic material. The passivation layer 150 may comprise an inorganic material such as silicon nitride, silicon oxide, silicon oxynitride, or silicon nitrogen oxide. The contact hole CTH may be formed in the passivation layer 150. The first wiring layer 201 below the passivation layer 150 may be exposed by partially removing the passivation layer 150. The pixel electrode 190 may be inserted in the contact hole CTH.

A first height difference compensating layer 170 may be disposed on the passivation layer 150. The first height difference compensating layer 170 may provide a space in which elements such as the pixel electrode 190 can be stably arranged, by at least partially compensating for, or planarizing, height differences formed by the elements disposed on the lower base 110. The material of the first height difference compensating layer 170 may have insulation and planarization characteristics. For example, the first height difference compensating layer 170 may comprise an organic material such as an acrylic resin, an epoxy resin, or a caldo resin. The contact hole CTH may be formed in the first height difference compensating layer 170. The first wiring layer 201 below the first height difference compensating layer 170 may be exposed by partially removing the first height difference compensating layer 170. The pixel electrode 190 may be inserted in the contact hole CTH.

The pixel electrode 190 may be disposed on the first height difference compensating layer 170. The pixel electrode 190 may be a field-generating electrode for generating an electric field in the liquid crystal layer 500 together with a common electrode 490. The pixel electrode 190 may be disposed in each pixel PX, may be electrically connected to the TFT TR, and may be independently controllable. The electric field generated by the pixel electrode 190 and the common electrode 490 may control the behavior of liquid crystals 510 in the corresponding pixel PX and may realign the liquid crystals 510. The pixel electrode 190 may be electrically connected to the drain member DP of the TFT TR via the contact hole CTH, which is formed in the first height difference compensating layer 170, the passivation layer 150, and the second portion 221b of the first wiring layer 201. Specifically, the pixel electrode 190 may be in contact with the first portion 221a of the first wiring layer 201 via the contact hole CTH. Also, the pixel electrode 190 may be in contact with the inner sidewalls of the contact hole CTH in the second portion 221b of the first wiring layer 201.

The pixel electrode 190 may comprise a transparent conductive material. Examples of the transparent conductive material include indium tin oxide (ITO), indium zinc oxide (IZO), zinc oxide (ZnO), indium(III) oxide ($In_2O_3$), indium gallium oxide (IGO), and aluminum zinc oxide (AZO).

The opposing substrate 400 may face the wiring substrate 101 and may be spaced apart from the wiring substrate 101 with the liquid crystal layer 500 interposed between the substrates 101 and 400. The opposing substrate 400 may include an upper base 410, a color conversion material 460, and the common electrode 490.

The upper base 410, like the lower base 110, may be a transparent insulating plate or a transparent insulating film. For example, the upper base 410 may comprise a glass material, a quartz material, or a light-transmitting plastic material.

A light-blocking material 440 may be disposed on the upper base 410. The light-blocking material 440 may absorb at least some light and may thus block the transmission of light. For example, the light-blocking material 440 may comprise a light-blocking colorant such as a black pigment or dye. In one embodiment, the light-blocking material 440 may extend substantially in the first direction X and may overlap with the TFT TR and the contact hole CTH, thereby preventing light leakage in any unintended areas.

The color conversion material 460 may be disposed on the light-blocking material 440. The color conversion material 460 may convert incident light into light having a different color from the incident light. For example, the color conversion material 460 may be a color filter having a colorant such as a pigment or dye scattered therein. In another example, the color conversion material 460 may be a wavelength shifter having quantum dots scattered therein. Although not specifically illustrated, a red color conversion filter may be disposed in each red pixel, a green color conversion filter may be disposed in each green pixel, and a blue color conversion filter may be disposed in each blue pixel. As a result, each pixel PX of the display device 1 can display different primary colors.

A second height difference compensating layer 470 may be disposed on the color conversion material 460. The second height difference compensating layer 470 may provide a space in which elements such as the common electrode 490 can be stably arranged, by at least partially compensating for, or planarizing, height differences formed by the elements disposed on the upper base 410. The second height difference compensating layer 470 may comprise the same material as, or a different material from, the first height difference compensating layer 170.

The common electrode 490 may be disposed on the second height difference compensating layer 470. The common electrode 490 may generate an electric field in the liquid crystal layer 500 together with the pixel electrode 190. The common electrode 490 may be arranged over multiple pixels PX without regard to the distinction between the pixels PX. The common electrode 490, like the pixel electrode 190, may comprise a transparent conductive material.

The liquid crystal layer 500 may be encapsulated by the wiring substrate 101, the opposing substrate 400, and a sealing member (not illustrated) bonding the wiring substrate 101 and the opposing substrate 400. The liquid crystal layer 500 may include the liquid crystals 510, which are initially aligned. As used herein, the term "liquid crystal" refers to a single molecule having liquid crystal characteristics or a group of such single molecules. In one embodiment, the liquid crystals 510 may have negative dielectric anisotropy and may be initially aligned so that their long axes can be substantially perpendicular to the plane where the first and second directions/axes X and Y belong.

The first and second wiring layers 201 and 300 of the wiring substrate 101 of the display device 1 may include the second and fifth material layers 221 and 350, respectively, which both comprise molybdenum oxide. The second and fifth material layers 221 and 350 can suppress reflection of external light by the first and fourth material layers 210 and 340 by covering the top surfaces of the first and fourth material layers 210 and 340.

Figure 5:
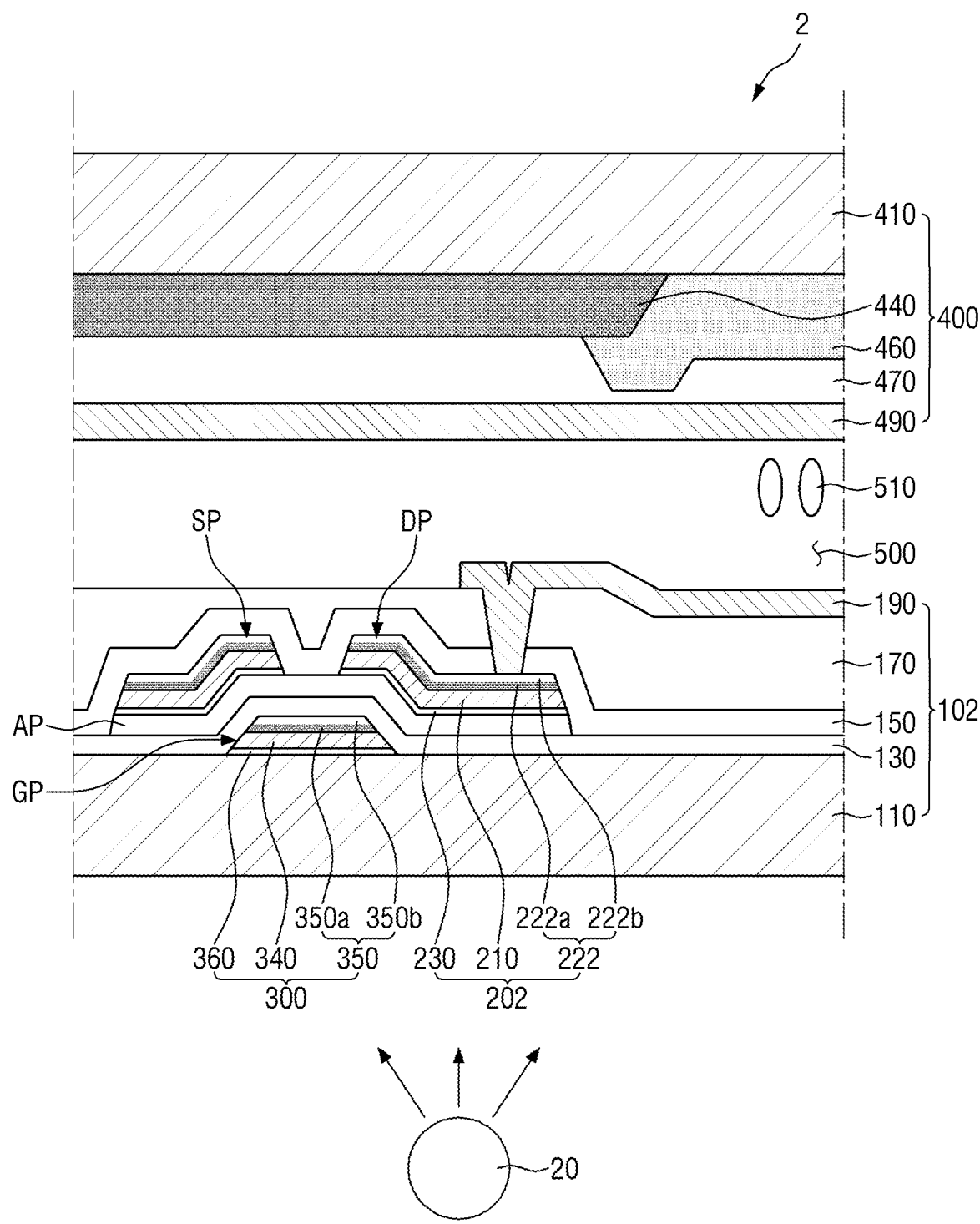
FIG. 5 is a cross-sectional view of a display device according to an embodiment.

FIG. 5 is a cross-sectional view of a display device 2 according to an embodiment. The display device 2 may include elements and/or structures identical to and/or analogous to elements and/or structures of the display device 1 described above.

Referring to FIG. 5, a wiring substrate 102 of the display device 2 includes a first wiring layer 202, a second wiring layer 300, a semiconductor material layer AP, and a pixel electrode 190. In the display device 2, unlike in the display device 1, the pixel electrode 190 is in contact with a second portion 222b of a second material layer 222 of the first wiring layer 202.

The second portion 222b does not have any contact hole and may completely cover a first portion 222a of the second material layer 222. Accordingly, the second portion 222b can prevent the first portion 222a from being damaged.

FIGS. 6 through 10 are cross-sectional views illustrating structures formed in forming a second wiring layer 300. FIG. 11 is a cross-sectional view illustrating a process step of forming a gate insulating layer 130. FIGS. 12 through 19 are cross-sectional views illustrating structures formed in forming a semiconductor material layer AP and a first wiring layer 201. FIG. 20 is a cross-sectional view illustrating a process step of forming a passivation layer 150'. FIGS. 21 through 24 are cross-sectional views illustrating structures formed in forming a height difference compensating layer 170 and a pixel electrode 190.

Referring to FIGS. 6 through 10, the second wiring layer 300 is formed on a lower base 110. The step of forming the second wiring layer 300 may include the steps of forming a fourth metal layer 345, forming a fifth metal layer 355, and etching the fourth and fifth metal layers 345 and 355 in a batch manner. In some embodiments, the step of forming the second wiring layer 300 may further include the step of forming a sixth metal layer 365.

Figure 6:
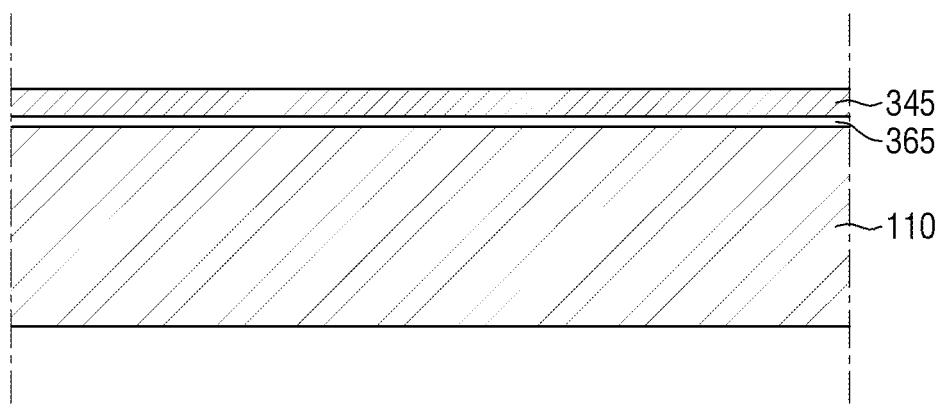
FIG. 6, FIG. 7, FIG. 8, FIG. 9, FIG. 10, FIG. 11, FIG. 12, FIG. 13, FIG. 14, FIG. 15, FIG. 16, FIG. 17, FIG. 18, FIG. 19, FIG. 20, FIG. 21, FIG. 22, FIG. 23, and FIG. 24 are cross-sectional views illustrating structures formed in a method of fabricating a wiring substrate according to an embodiment.

For example, as illustrated in FIG. 6, the sixth metal layer 365 and the fourth metal layer 345 are sequentially formed on the lower base 110. A method to form the sixth metal layer 365 and the fourth metal layer 345 is not particularly limited. For example, the sixth metal layer 365 and the fourth metal layer 345 may be formed by sputtering. The sixth metal layer 365 and the fourth metal layer 345 may have the same material and the same thickness as the sixth material layer 360 and the fourth material layer 340, respectively, of FIG. 3.

Figure 7:
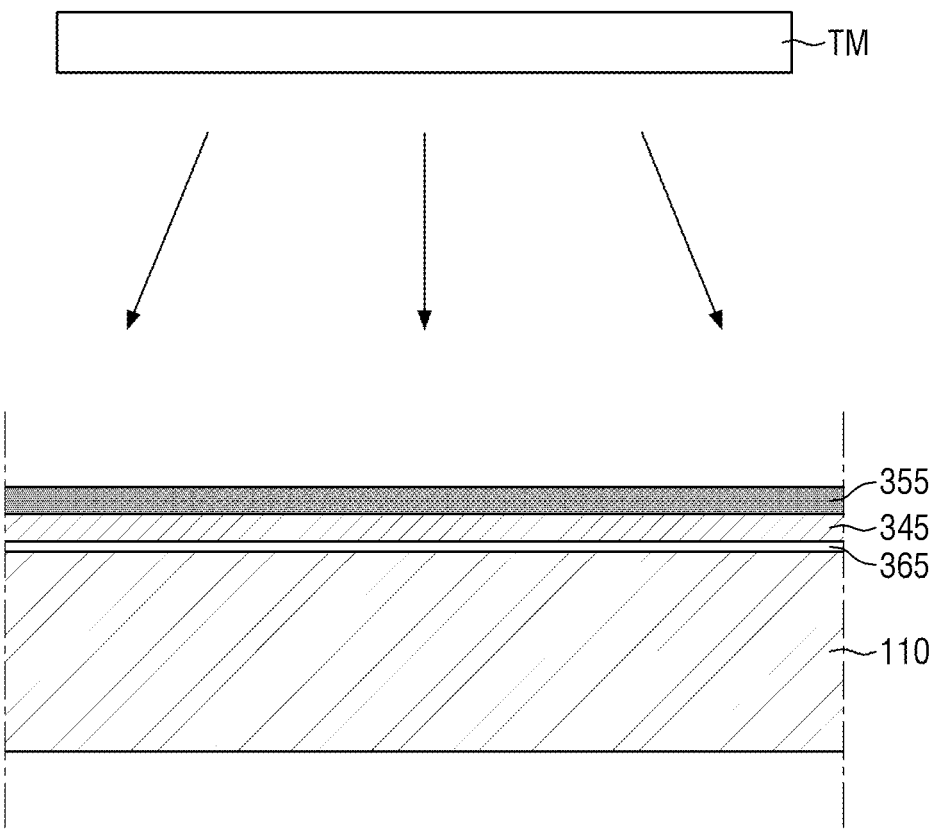

Thereafter, referring to FIG. 7, the fifth metal layer 355 is formed on the fourth metal layer 345. In one embodiment, the step of forming the fifth metal layer 355 may include depositing the fifth metal layer 355 directly on the fourth metal layer 345 by performing a sputtering process, and the sputtering process may be a direct current (DC) sputtering process using a DC voltage source.

The sputtering process may be performed in an inert gas atmosphere such as an argon (Ar) or nitrogen ($N_2$) gas atmosphere. A target material TM of the sputtering process may comprise $MoO_x$ (1.9≤x≤2.1). For example, the target material TM may be molybdenum oxide having a substantially uniform composition ratio. The target material TM may consist of only Mo atoms and O atoms, and the Mo:O composition ratio of the target material TM may be in a range of about 1:1.9 to about 1:2.1, in a range of about 1:1.95 to about 1:2.05, or about 1:2.0. Accordingly, the fifth metal layer 355, which has substantially the same composition and composition ratio as the target material TM, can be formed, and the Mo:O composition ratio of the fifth metal layer 355 can be precisely controlled. The fifth metal layer 355 may have the same material and the same thickness as the fifth material layer 350 of FIG. 3.

Figure 8:
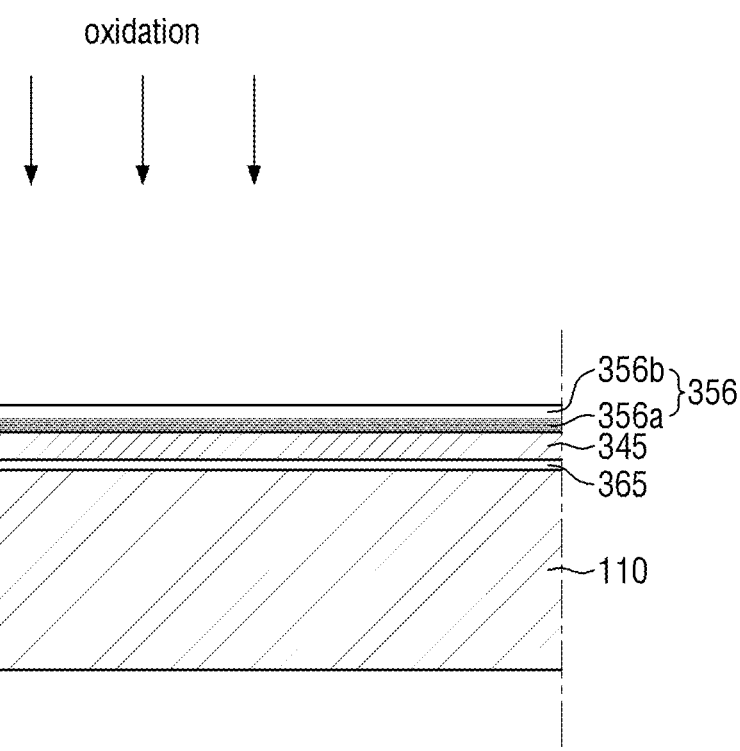

Thereafter, referring to FIG. 8, the fifth metal layer 355 is partially oxidized, thereby obtaining a fifth metal layer 356. The step of partially oxidizing the fifth metal layer 355 may be the step of forming the fifth metal layer 356 including third and fourth portions 356a and 356b having different composition ratios. For example, the oxygen content of the fourth portion 356b may be greater than the oxygen content of the third portion 356a.

The step of partially oxidizing the fifth metal layer 355 may include the step of oxidizing the surface of the fifth metal layer 355 by placing the fifth metal layer 355 in contact with distilled water, or with the air or oxygen. The third and fourth portions 356a and 356b may have the same material and the same thickness as the third and fourth portions 350a and 350b, respectively, of FIG. 3.

Figure 9:
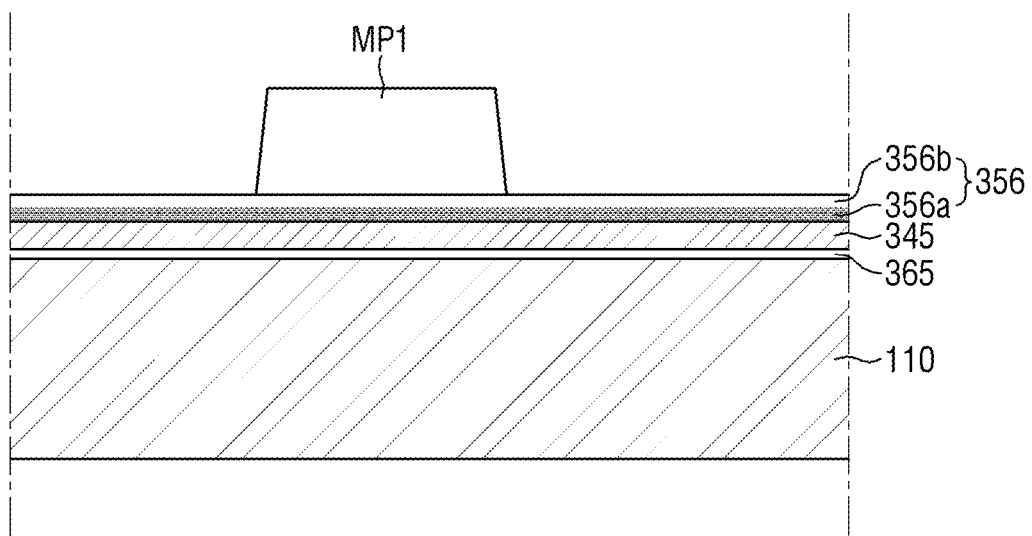

Thereafter, referring to FIG. 9, a first mask MP1 is formed on the fourth portion 356b of the fifth metal layer 356. The first mask MP1 may comprise a positive photosensitive material or a negative photosensitive material.

Figure 10:
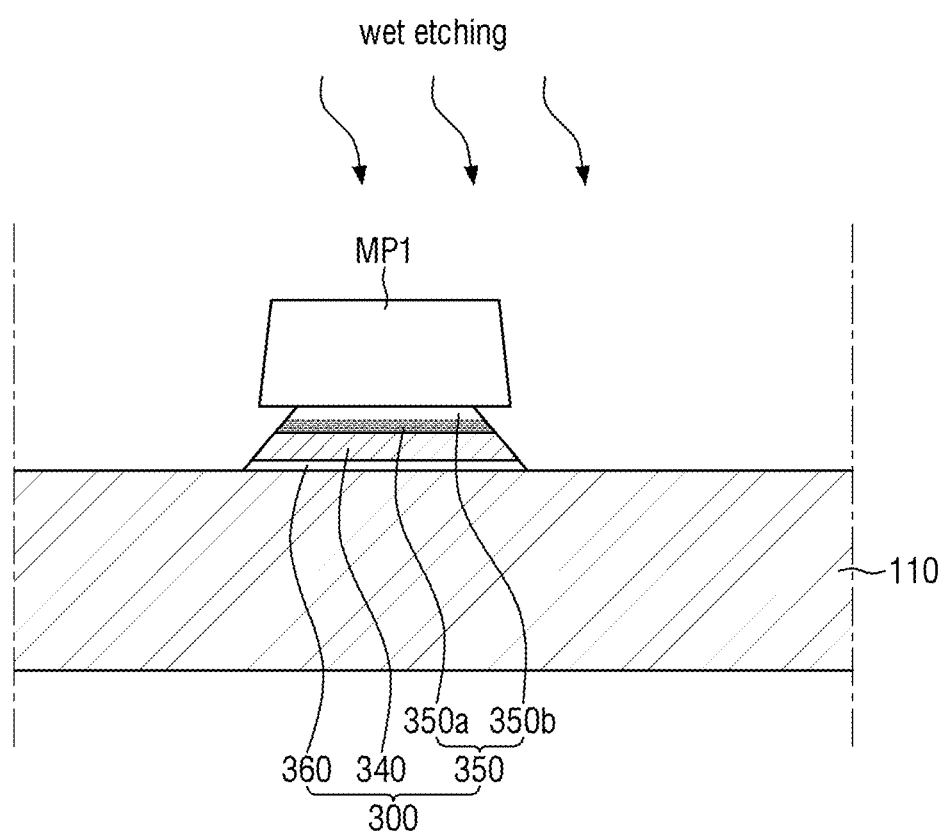
Figure 11:
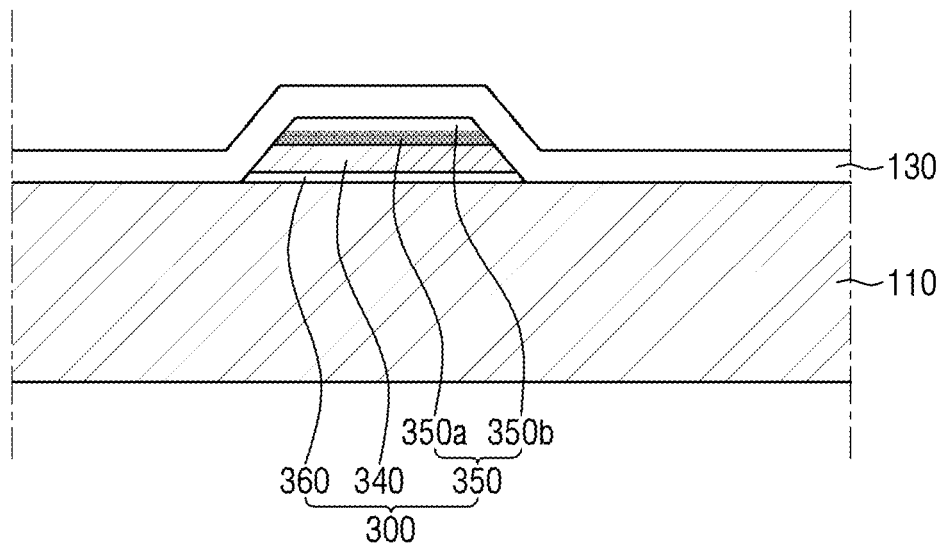

Thereafter, referring to FIG. 10, the fourth, fifth, and sixth metal layers 345, 356, and 365 are etched in a batch manner using the first mask MP1 as an etching mask. As a result, fourth, fifth, and sixth material layers 340, 350, and 360 are formed.

In one embodiment, the step of etching the fourth, fifth, and sixth metal layers 345, 356, and 365 may include the step of wet-etching the fourth, fifth, and sixth metal layers 345, 356, and 365 using an etchant, and the etchant used in the etching of the fourth, fifth, and sixth metal layers 345, 356, and 365 may be a peroxosulfate-based etchant containing peroxosulfate having a concentration in a range of 10.0 wt % to 20.0 wt %. Examples of the peroxide sulfate include potassium peroxodisulfate ($K_2S_2O_8$), sodium peroxodisulfate ($Na_2S_2O_8$), and ammonium peroxodisulfate (($NH_4)_2S_2O_8$).

The fourth, fifth, and sixth material layers 340, 350, and 360 may form a second wiring layer 300. An acute angle formed by two abutting sides of the second wiring layer 300 can be tuned by controlling the size and the location of the first mask material MP1, the composition of the etchant used in the etching of the fourth, fifth, and sixth metal layers 345, 356, and 365, and the duration of the etching of the fourth, fifth, and sixth metal layers 345, 356, and 365. The second wiring layer 300 is as already described above with reference to FIG. 3.

Thereafter, referring to FIG. 11, the first mask material MP1 is removed, and the gate insulating layer 130 is formed on the second wiring layer 300.

The first mask material MP1 may be removed by ashing. A method to form the gate insulating layer 130 is not particularly limited. For example, the gate insulating layer 130 may be formed by deposition.

Referring to FIGS. 12 through 19, a semiconductor material layer AP and the first wiring layer 201 are formed on the second wiring layer 300. The step of forming the first wiring layer 201 may include the steps of forming a first metal layer 215, forming a second metal layer 225, and etching the first and second metal layers 215 and 225 in a batch manner In some embodiments, the step of forming the first wiring layer 201 may further include the step of forming a third metal layer 235.

Figure 12:
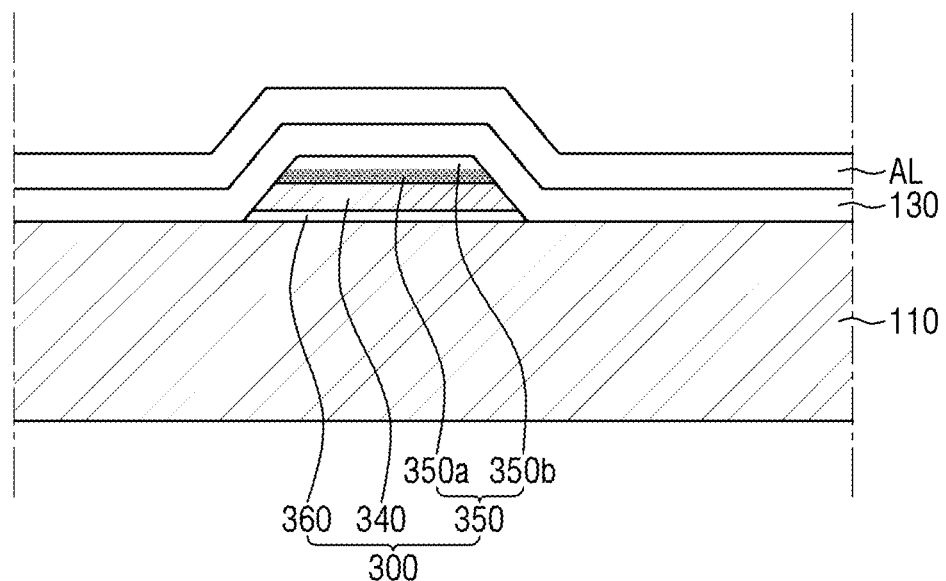

For example, referring to FIG. 12, a semiconductor layer AL is formed on the gate insulating layer 130. The semiconductor layer AL may comprise the same material as the semiconductor material layer AP of FIG. 3.

Figure 13:
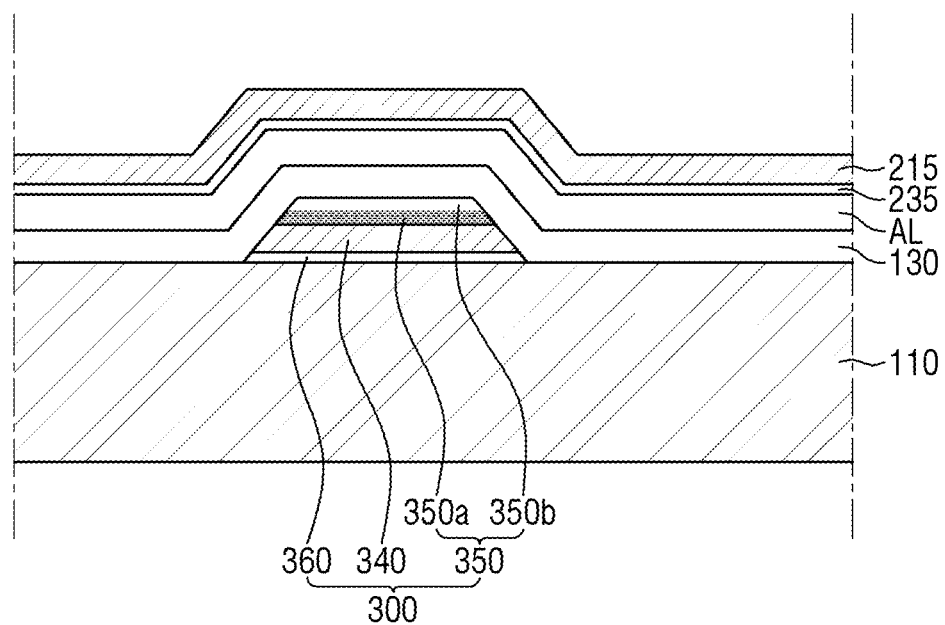

Thereafter, referring to FIG. 13, the third metal layer 235 and the first metal layer 215 are sequentially formed on the semiconductor layer AL. A method to form the third metal layer 235 and the first metal layer 215 is not particularly limited. For example, the third metal layer 235 and the first metal layer 215 may be formed by sputtering. The third metal layer 235 and the first metal layer 215 may have the same material and the same thickness as the third material layer 230 and the first material layer 210, respectively, of FIG. 3.

Figure 14:
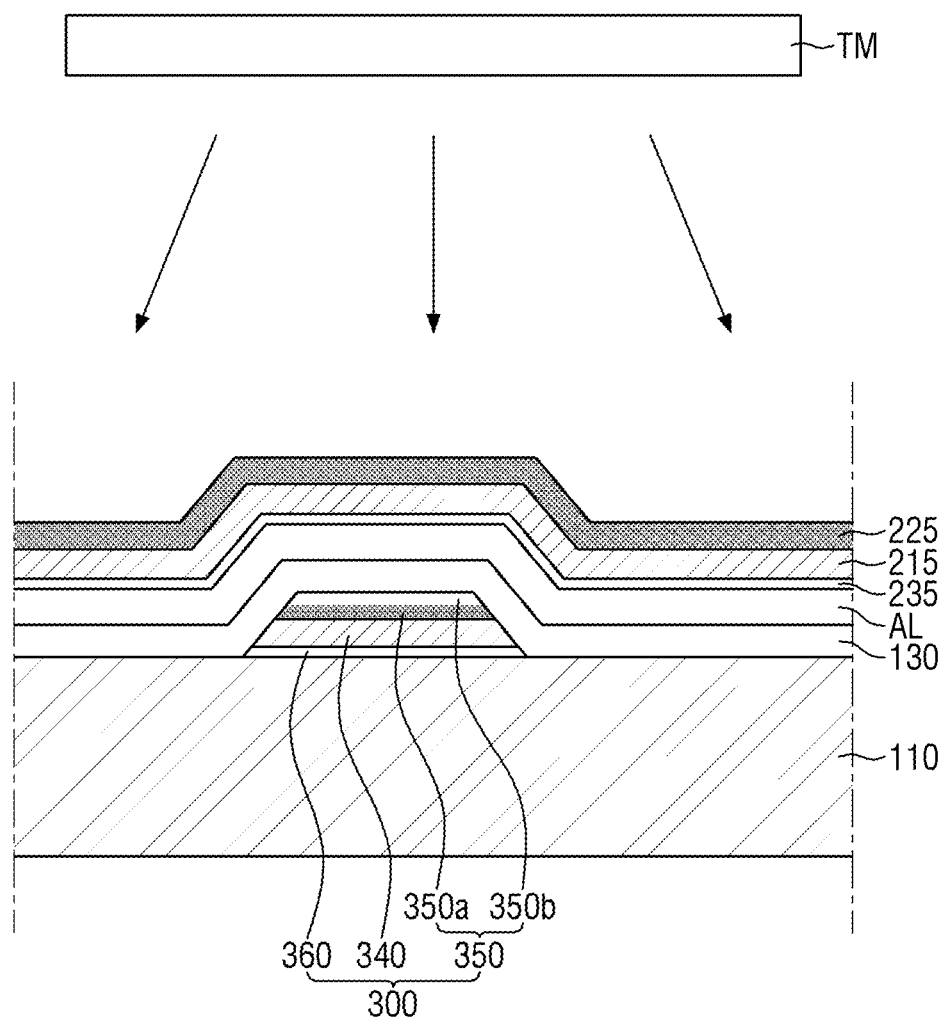

Thereafter, referring to FIG. 14, the second metal layer 225 is formed on the first metal layer 215. In one embodiment, the step of forming the second metal layer 225 may include the step of depositing the second metal layer 225 on the first metal layer 215 through sputtering.

The step of forming the second metal layer 225 may be performed in the same manner as the step of forming the fifth metal layer 355. For example, the step of forming the second metal layer 225 may be performed in an inert gas atmosphere such as an Ar or N2 gas atmosphere, and a target material TM comprising $MoO_x$ ($1.9 \leq x \leq 2.1$) may be used. The second metal layer 225 may have the same material and the same thickness as the second material layer 221 of FIG. 3.

Figure 15:
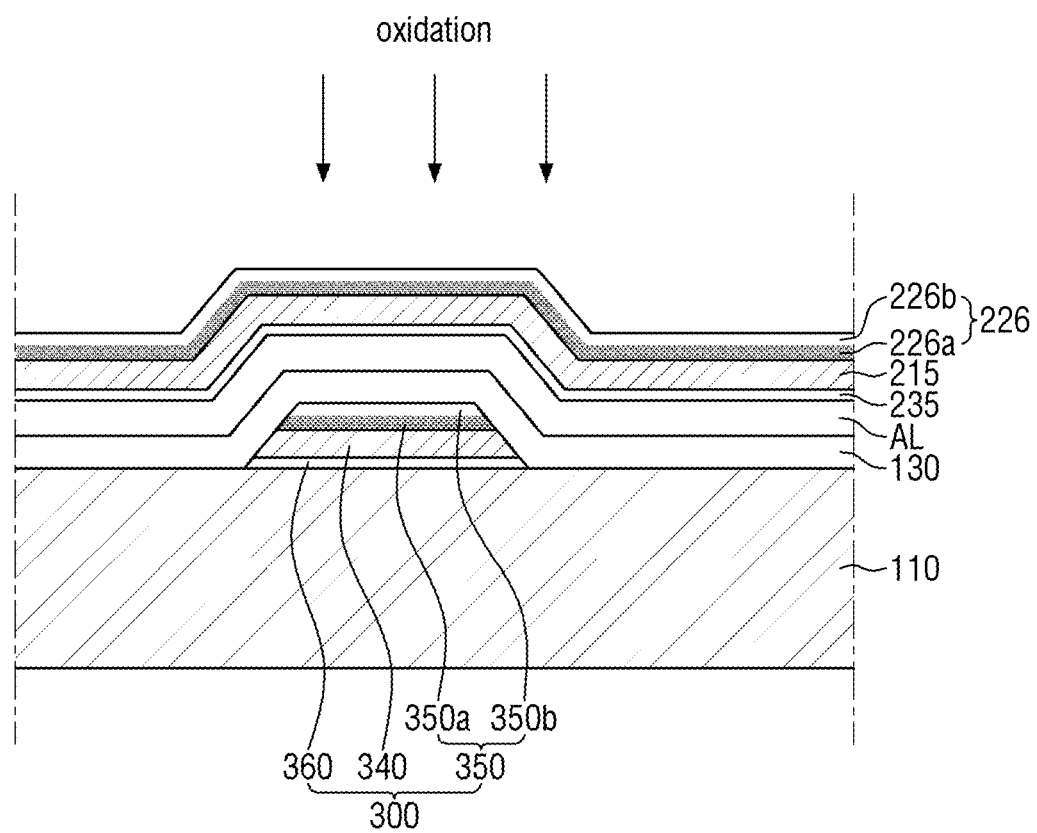

Thereafter, referring to FIG. 15, the second metal layer 225 is partially oxidized, thereby obtaining a second metal layer 226. The step of partially oxidizing the second metal layer 225 may be the step of forming the second metal layer 226 including first and second portions 226a and 226b having different composition ratios. For example, the oxygen content of the second portion 226b may be greater than the oxygen content of the first portion 226a.

The step of partially oxidizing the second metal layer 225 may include the step of oxidizing the surface of the second metal layer 225 by placing the second metal layer 225 in contact with distilled water, or with the air or oxygen. The first and second portions 226a and 226b may have the same material and the same thickness as the first and second portions 221a and 221b, respectively, of FIG. 3.

Figure 16:
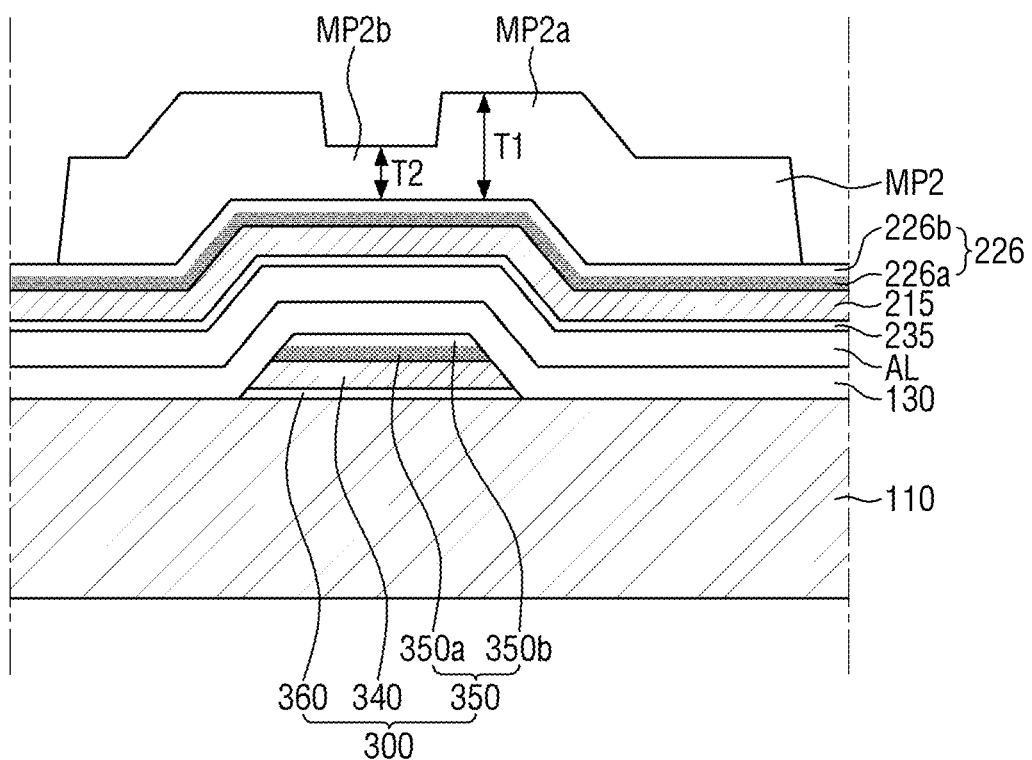

Thereafter, referring to FIG. 16, a second mask MP2 is formed on the second portion 226b of the second metal layer 226. The second mask MP2 may comprise a positive photosensitive material or a negative photosensitive material. In one embodiment, the second mask material MP2 may include a portion MP2a having a first thickness T1 and a portion MP2b having a second thickness T2, which is smaller than the first thickness T1. The second mask MP2 may be formed using a halftone mask or a slit mask.

Figure 17:
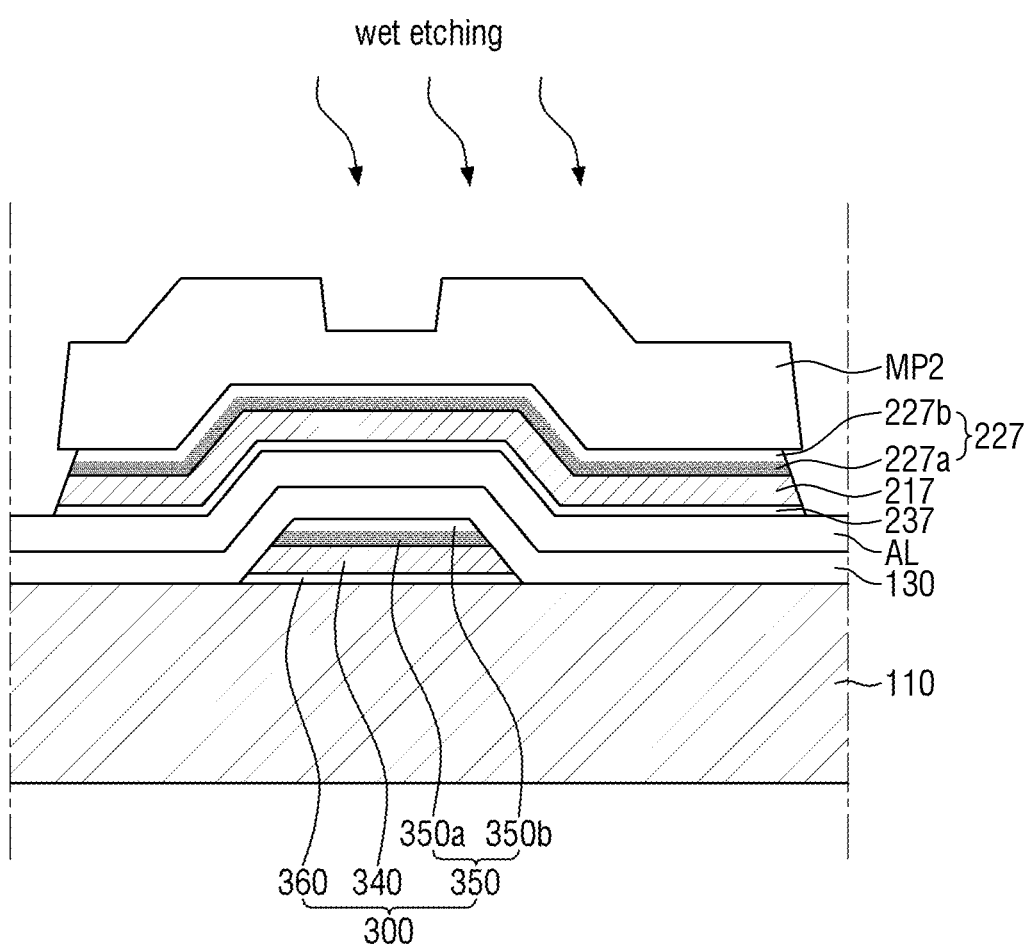

Thereafter, referring to FIG. 17, the first, second, and third metal layers 215, 226, and 235 are etched in a batch manner using the second mask MP2 as an etching mask. As a result, first, second, and third material layers 217, 227, and 237 are formed.

In one embodiment, the step of etching the first, second, and third metal layers 215, 226, and 235 may include the step of wet-etching the first, second, and third metal layers 215, 226, and 235 using an etchant, and the etchant used in the etching of the first, second, and third metal layers 215, 226, and 235 may be a peroxosulfate-based etchant containing peroxosulfate having a concentration in a range of 10.0 wt % to 20.0 wt %.

An acute angle formed by two abutting sides of each of the first, second, and third material layers 217, 227, and 237 can be tuned by controlling the size and the location of the second mask material MP2, the composition of the etchant used in the etching of the first, second, and third metal layers 215, 226, and 235, and the duration of the etching of the first, second, and third metal layers 215, 226, and 235.

Figure 18:
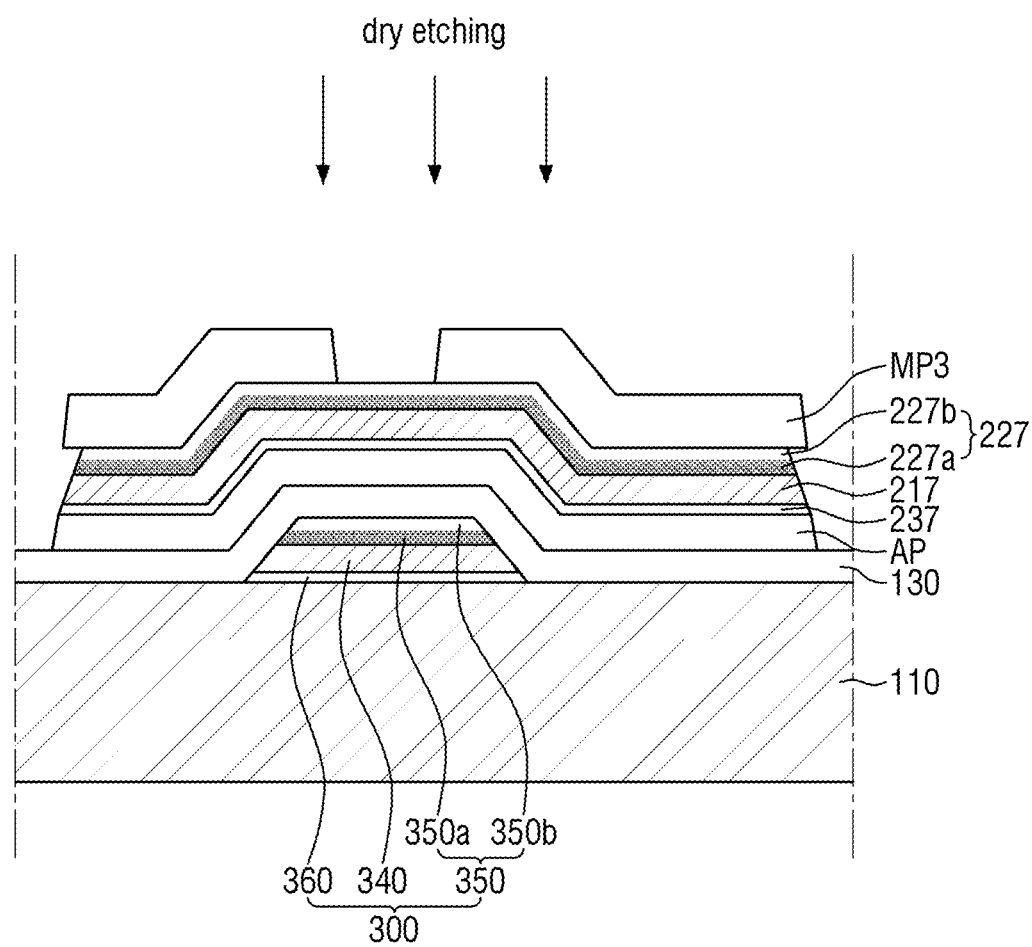

Thereafter, referring to FIG. 18, the semiconductor layer AL is etched using the second mask MP2 as an etching mask. As a result, the semiconductor material layer AP is formed. In one embodiment, the step of etching the semiconductor layer AL may be performed using dry etching, in which case, the second mask MP2 may be partially removed to form a third mask MP3. The third mask MP3 may partially expose the top surface of the second material layer 227. An acute angle formed by two abutting sides of the semiconductor material layer AP can be tuned by controlling the duration of the etching of the semiconductor layer AL. The semiconductor material layer AP is as already described above with reference to FIG. 3.

Figure 19:
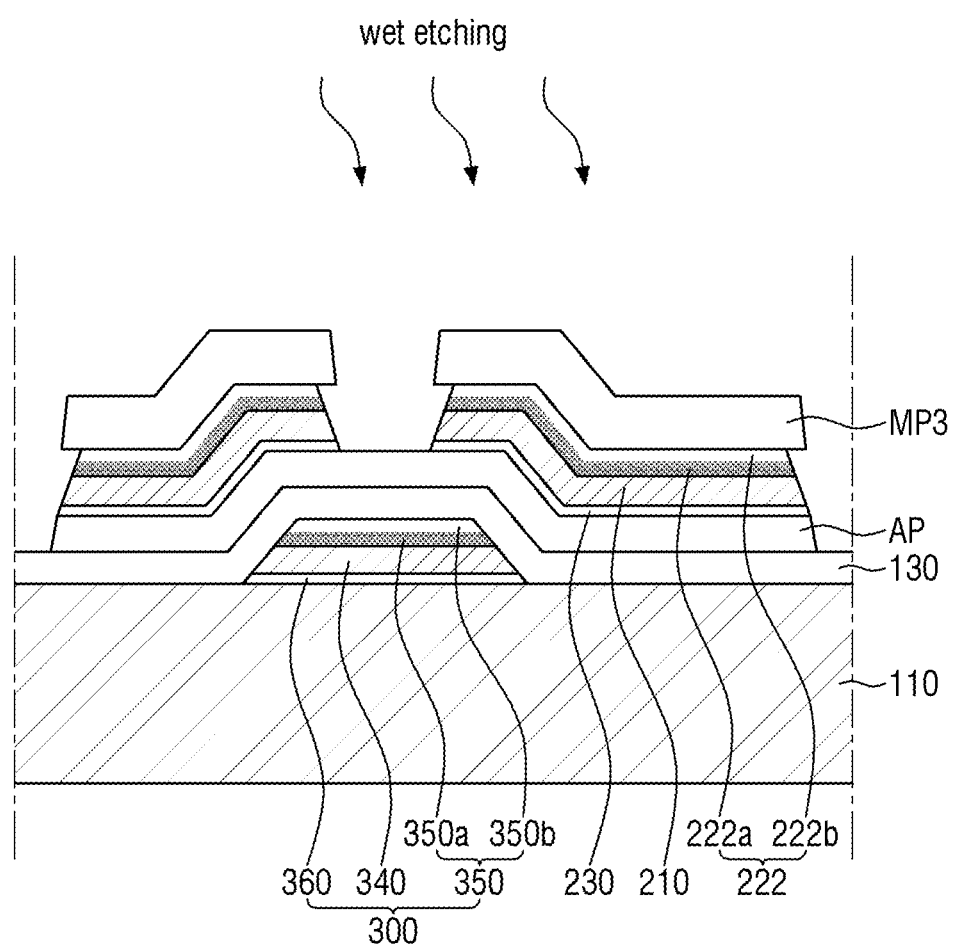
Figure 20:
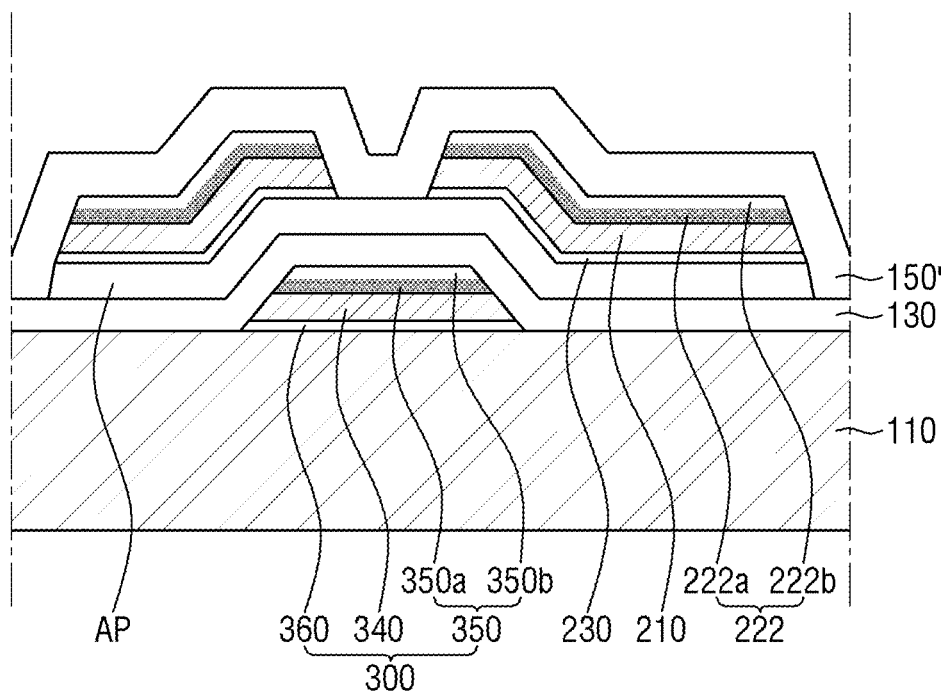

Thereafter, referring to FIG. 19, the first, second, and third material layers 217, 227, and 237 are etched in a batch manner using the third mask MP3 as an etching mask. In one embodiment, the step of etching the first, second, and third material layers 217, 227, and 237 may include the step of wet-etching the first, second, and third material layers 217, 227, and 237 using an etchant, and the etchant used in the etching of the first, second, and third material layers 217, 227, and 237 may be a peroxosulfate-based etchant containing peroxosulfate having a concentration in a range of 10.0 wt % to 20.0 wt %. As a result of the etching of the first, second, and third material layers 217, 227, and 237, first, second, and third material layers 210, 222, and 230 are formed.

Thereafter, referring to FIG. 20, the third mask MP3 is removed, and a passivation layer 150' is formed on the first wiring layer 201. The passivation layer 150' does not have any contact hole and may completely cover the second wiring layer 300.

Thereafter, referring to FIGS. 21 through 24, the height difference compensating layer 170 and the pixel electrode 190 are formed.

Figure 21:
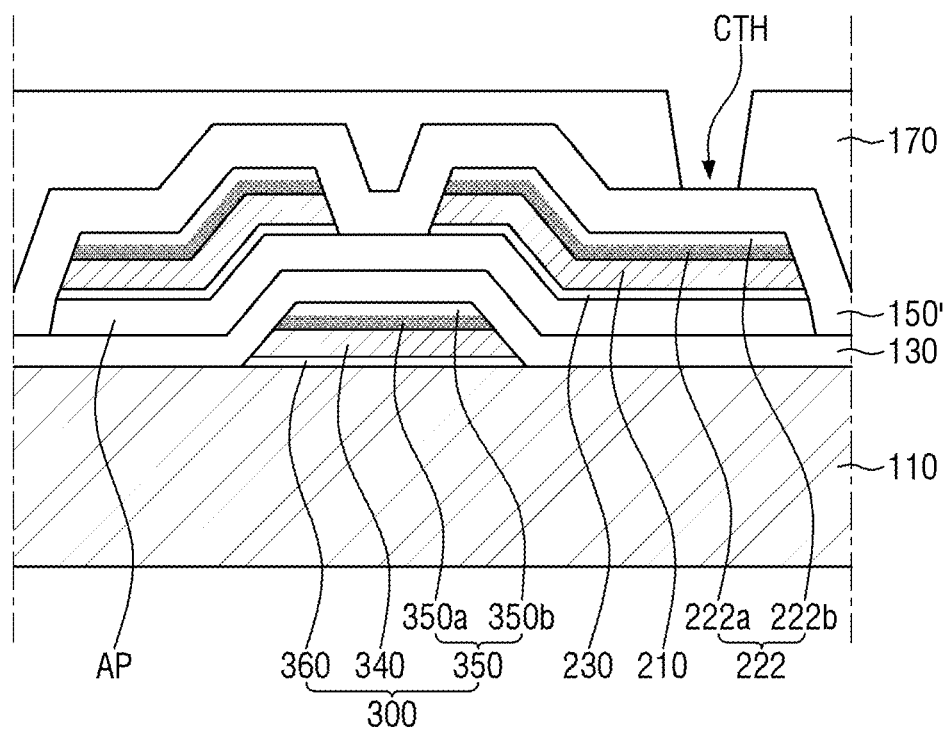

For example, referring to FIG. 21, the height difference compensating layer 170 (for example, a first height difference compensating layer) is formed on the passivation layer 150'. In one embodiment, the height difference compensating layer 170 may comprise a negative photosensitive material or a positive photosensitive material. The height difference compensating layer 170 may have a contact hole CTH. The contact hole CTH of the height difference compensating layer 170 may partially expose the passivation layer 150'.

Figure 22:
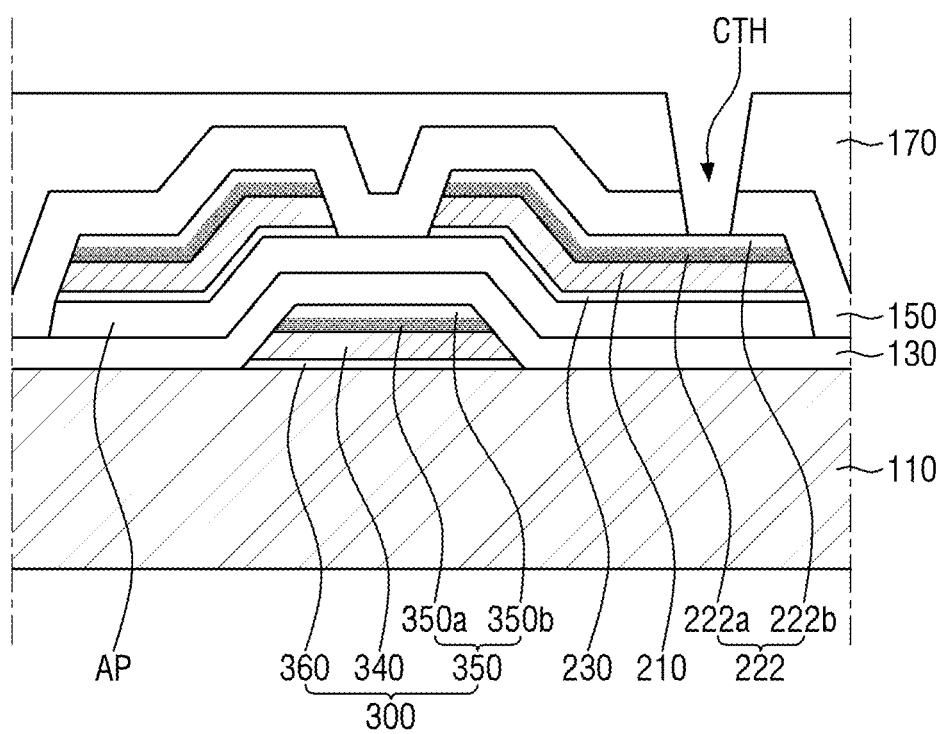

Thereafter, referring to FIG. 22, the contact hole CTH is further formed in the passivation layer 150', thereby obtaining a passivation layer 150. The passivation layer 150 may partially expose the second portion 222b of the second material layer 222 of the first wiring layer 201.

Figure 23:
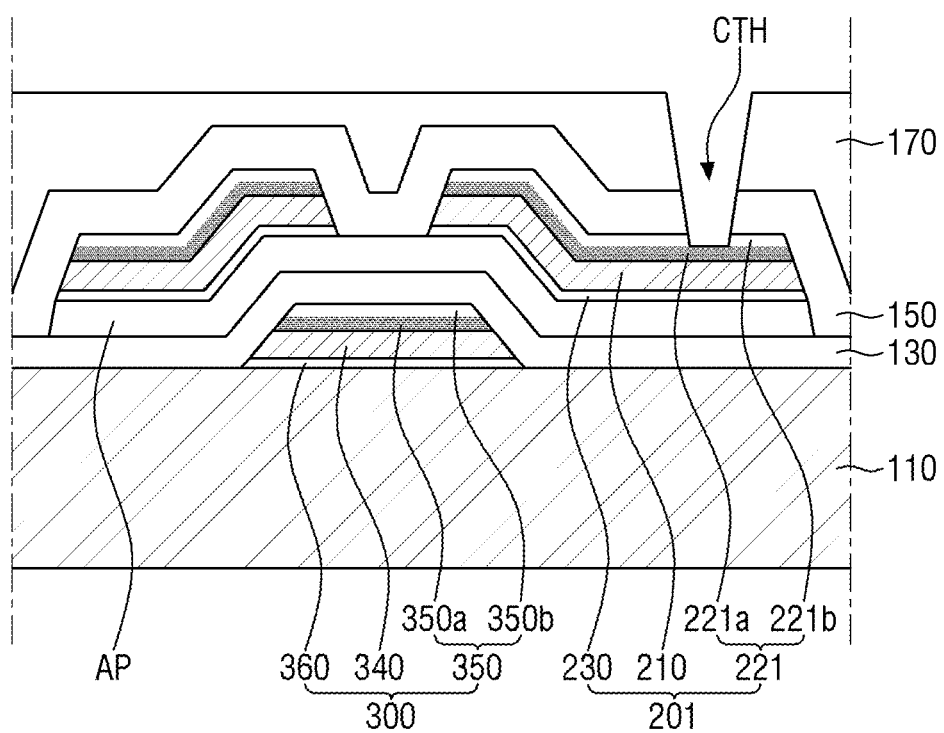

Thereafter, referring to FIG. 23, the contact hole CTH is further formed in the second portion 221b of the second material layer 221, thereby obtaining a second material layer 221 including first and second portions 221a and 221b. Due to the presence of the contact hole CTH, the second portion 221b may partially expose the first portion 221a. The first material layer 210, the second material layer 221, and the third material layer 230 may form the first wiring layer 201. The first wiring layer 201 is as already described above with reference to FIG. 3.

Figure 24:
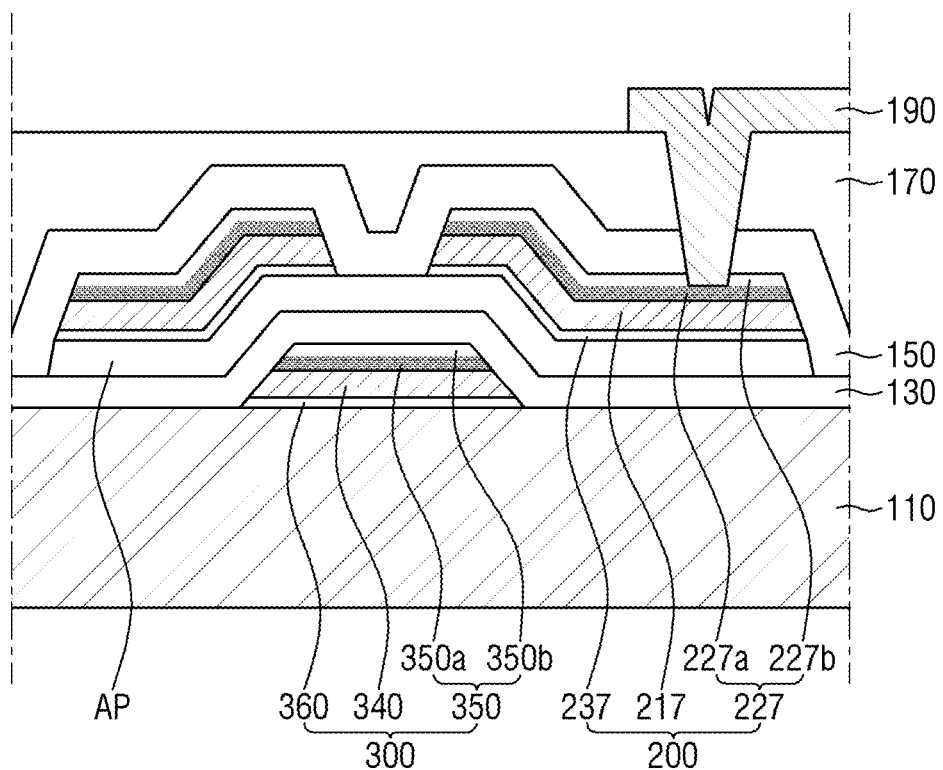

Thereafter, referring to FIG. 24, the pixel electrode 190 is formed on the height difference compensating layer 170. The pixel electrode 190 may be in contact with the first portion 221a of the second material layer 221 of the first wiring layer 201 through the contact hole CTH, which is formed in the height difference compensating layer 170, the passivation layer 150, and the second portion 221b of the first wiring layer 201. Also, the pixel electrode 190 may be in contact with the inner sidewalls of the contact hole CTH in the second portion 221b.

Embodiments are further described with reference to the following experimental examples.

EXPERIMENTAL EXAMPLE 1

Measurement of Light Absorption and Light Reflectance of Molybdenum Oxide

Figure 25:
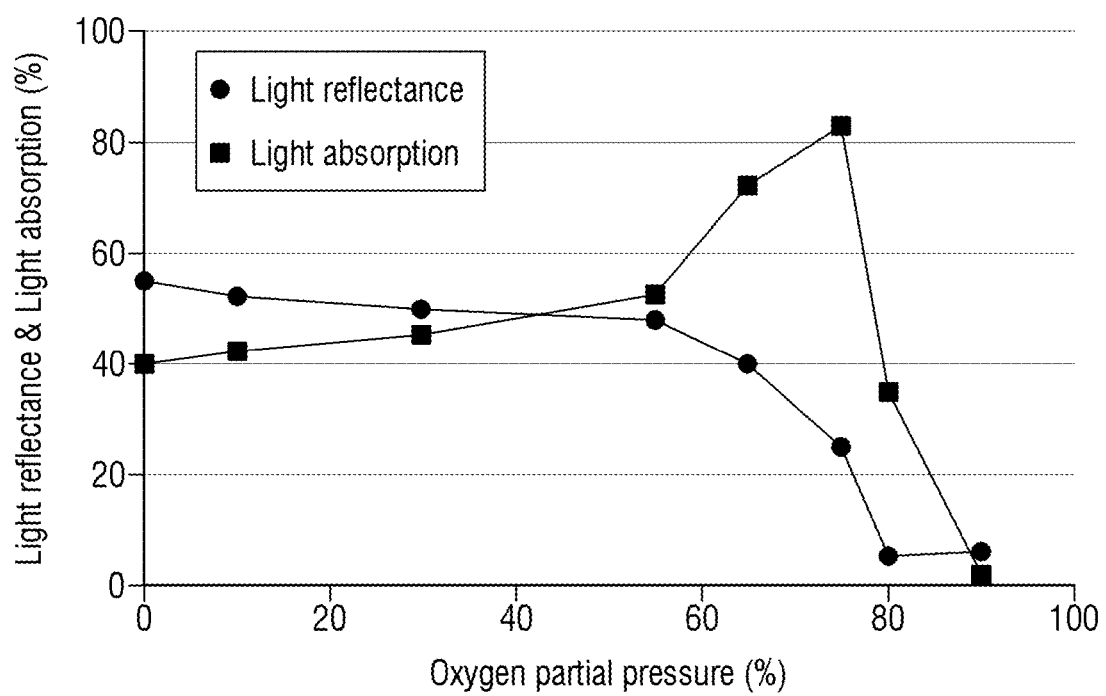
FIG. 25 is a graph showing the results of Experimental Example 1.

A molybdenum layer was formed on glass. Then, molybdenum oxide was formed by changing the oxygen partial pressure, and the light absorption and light reflectance of the molybdenum oxide were measured. The results of the measurement are as shown in FIG. 25. FIG. 25 shows that molybdenum oxide prepared at a high oxygen partial pressure has a relatively high oxygen composition ratio. Molybdenum oxide prepared at an oxygen partial pressure of about 65% or about 75% generally has the composition $MoO_2$, and molybdenum oxide prepared at an oxygen partial pressure of 80% or higher generally has the composition $MoO_3$.

Referring to FIG. 25, in the range of oxygen partial pressures of 0% to 80%, the higher the oxygen partial pressure, the lower the light reflectance of the prepared molybdenum oxide.

As the oxygen partial pressure increases, the light absorption of the prepared molybdenum oxide gradually increases to its maximum at an oxygen partial pressure of about 75% and then rapidly decreases.

That is, molybdenum oxide prepared at an oxygen partial pressure of about 65% or about 75% and having the composition $MoO_2$ has excellent light absorption characteristics.

EXPERIMENTAL EXAMPLE 2

Formation of Al/$MoO_2$ Structure

A $MoO_2$ layer was formed on glass, and an Al layer was formed on the $MoO_2$ layer. Then, a mask having a thickness of 1.5 µm was formed on the Al layer. A positive photosensitive material was used to form the mask. Thereafter, the Al layer and the $MoO_2$ layer were etched using the mask as an etching mask and using a peroxosulfate-based etchant, thereby obtaining a structurer according to Experimental Example 2.

Figure 26:
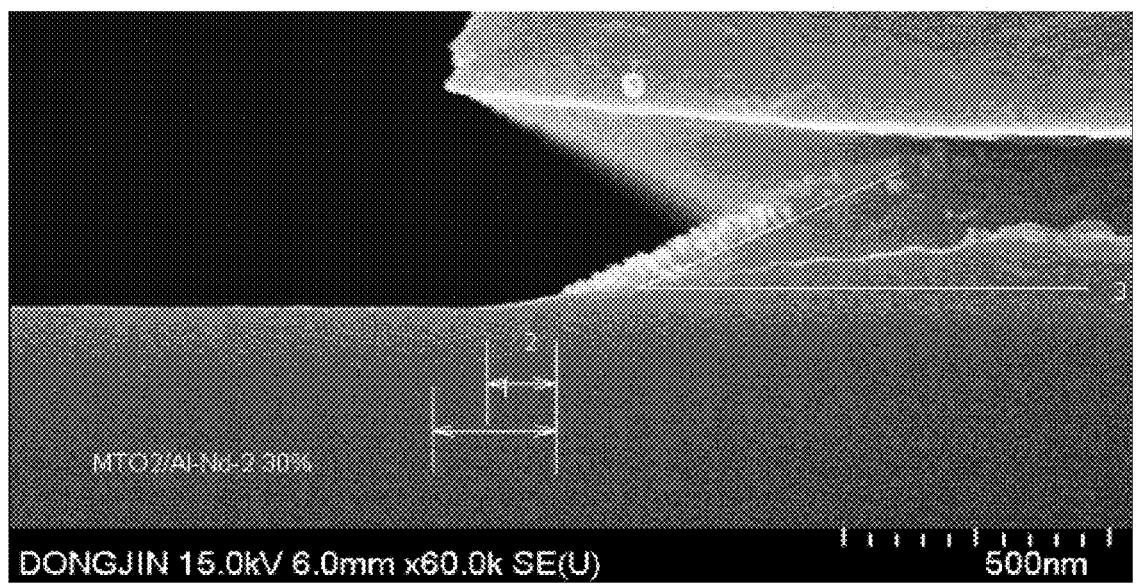
FIG. 26 shows the cross-sectional profile of a structure fabricated in accordance with Experimental Example 2.

FIG. 26 shows the cross-sectional profile of the structure according to Experimental Example 2. The structure according to Experimental Example 2 had a taper angle of about 25° and a critical dimension (CD) skew of about 0.23 µm. Here, the term "taper angle" means the acute angle formed by two abutting sides of a structure obtained by etching, and the term "CD skew" means the difference between the after development inspection (ADI) CD and the after cleaning inspection (ACI) CD of a mask.

Referring to FIG. 26, $MoO_2$ has excellent batch etching characteristics with respect to Al, and the sides of the $MoO_2$ layer of the structure according to Experimental Example 2 and the sides of the Al layer of the structure according to Experimental Example 2 are substantially aligned with each other.

EXPERIMENTAL EXAMPLE 3

Formation of Cu/$MoO_2$ Structure

A Ti layer and a Cu layer were sequentially formed on glass, and a $MoO_2$ layer was formed on the Cu layer. Then, a mask having a thickness of 1.5 µm was formed on the $MoO_2$ layer. A positive photosensitive material was used to form the mask. Thereafter, the $MoO_2$ layer, the Cu layer, and the Ti layer were etched using the mask as an etching mask and using a peroxosulfate-based etchant, thereby obtaining a structure according to Experimental Example 3.

Figure 27:
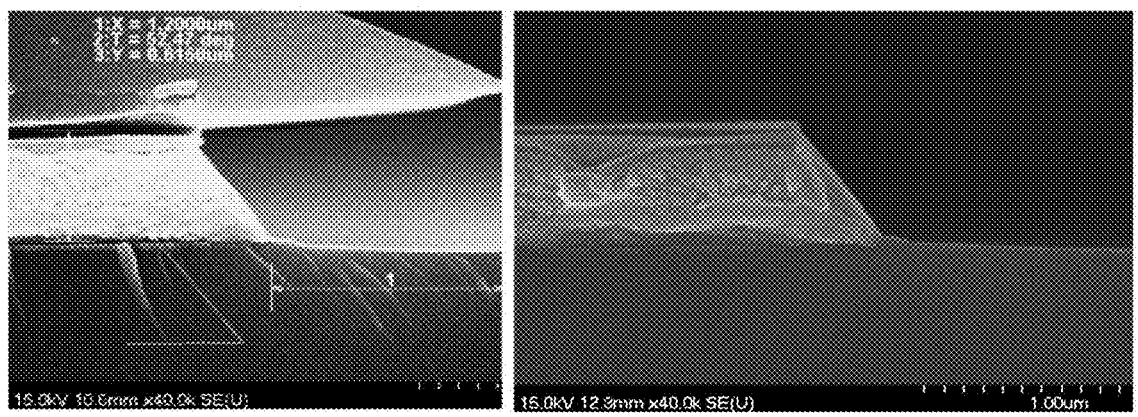
FIG. 27 shows the cross-sectional profile of a structure fabricated in accordance with Experimental Example 3.

FIG. 27 shows the cross-sectional profile of the structure according to Experimental Example 3. The structure according to Experimental Example 3 had a taper angle of about 52° and a CD skew of about 1.2 µm.

Referring to FIG. 27, $MoO_2$ has excellent batch etching characteristics with respect to Cu and Ti, and the sides of the $MoO_2$ layer of the structure according to Experimental Example 3 and the sides of the Cu layer of the structure according to Experimental Example 3 are substantially aligned with each other.

COMPARATIVE EXAMPLE 1

Formation of Cu/$MoTa_xO_y$ Structure

A structure according to Comparative Example 1 was fabricated in the same manner as the structure according to Experimental Example 3 except for using $MoTa_xO_y$, instead of $MoO_2$.

Figure 28:
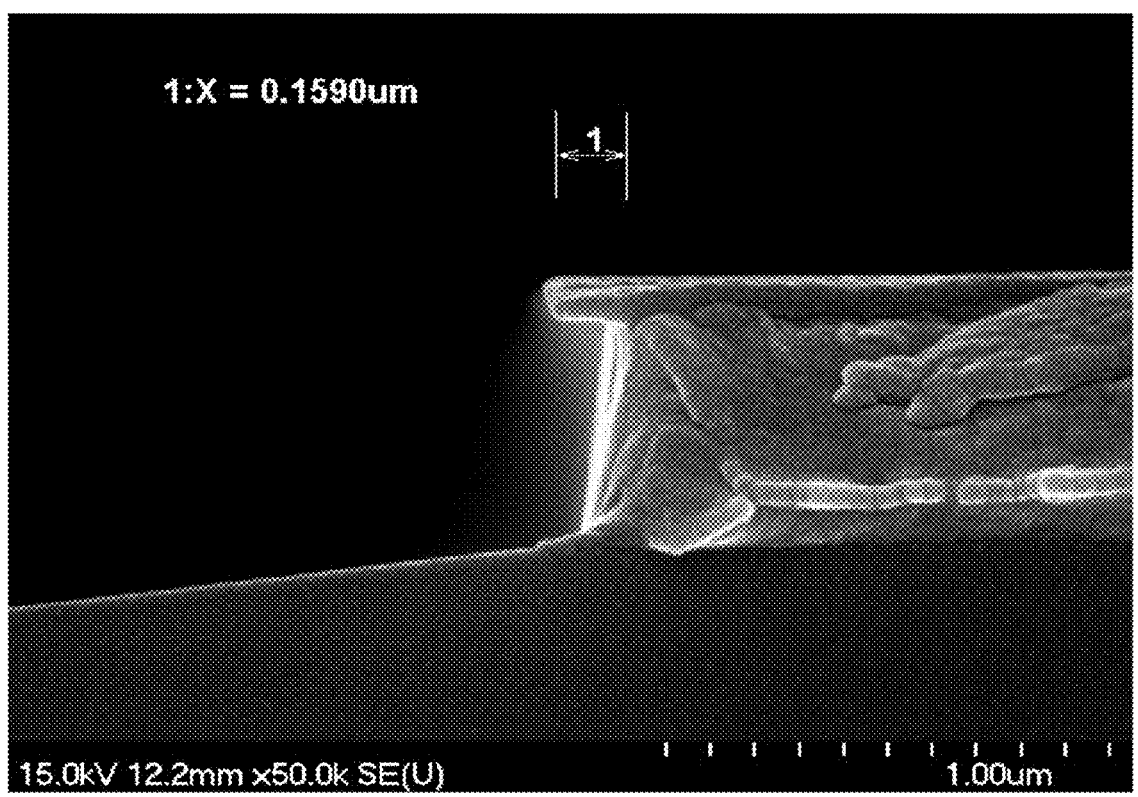
FIG. 28 shows the cross-sectional profile of a structure fabricated in accordance with Comparative Example 1.

FIG. 28 shows the cross-sectional profile of the structure according to Comparative Example 1. The tip length of the structure according to Comparative Example 1 was about 0.15 µm. Here, the term "tip length" refers to the horizontal length of a $MoTa_xO_y$ portion projected from a side of the Cu layer of the structure according to Comparative Example 1.

Referring to FIG. 28, $MoTa_xO_y$, unlike $MoO_2$, does not have batch etching characteristics with respect to Cu.

COMPARATIVE EXAMPLE 2

Detection of Tip Defect

Silicon oxide and silicon nitride were deposited to a thickness of about 500 Å on the structure according to Comparative Example 1, thereby obtaining a structure according to Comparative Example 2

Figure 29:
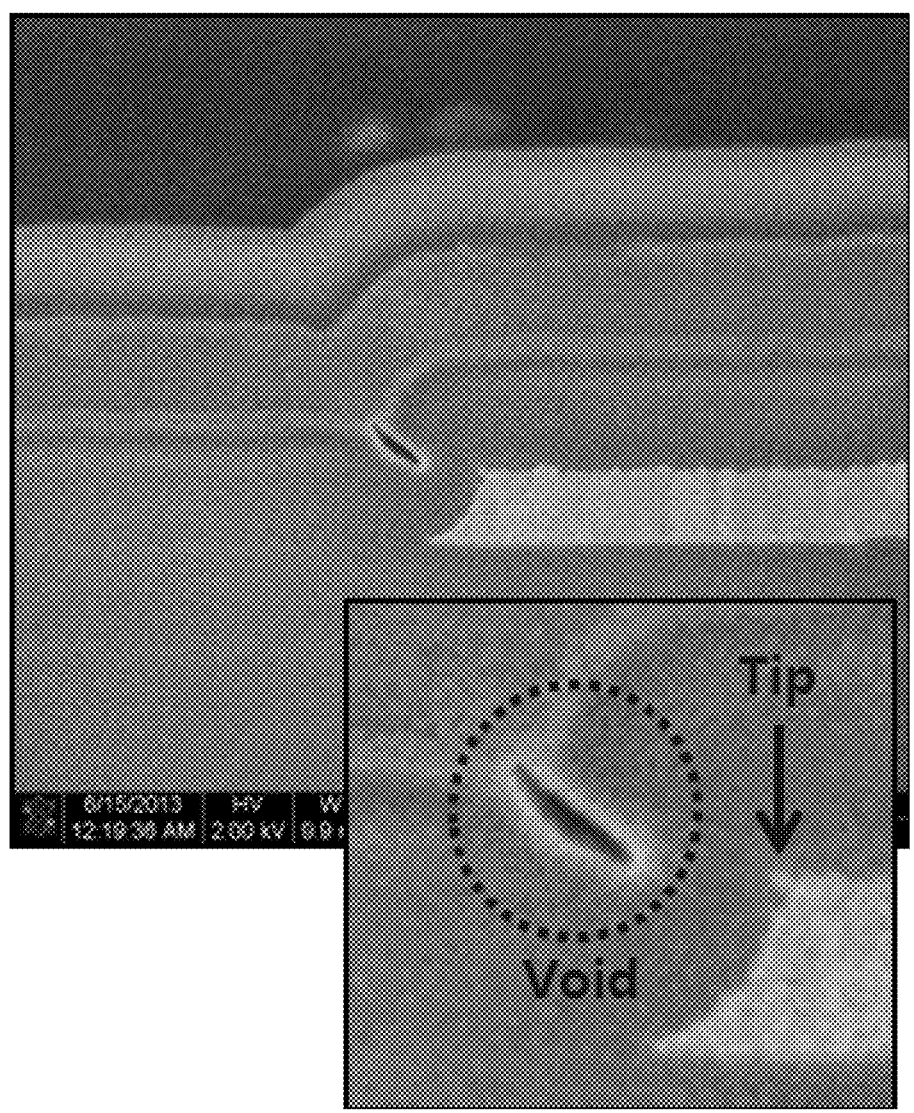
FIG. 29 shows the cross-sectional profile of a structure fabricated in accordance with Comparative Example 2.

FIG. 29 shows the cross-sectional profile of the structure according to Comparative Example 2. Referring to FIG. 29, there is a crack or a void in the silicon oxide layer of the structure according to Comparative Example 2 that may have been generated by the protruding tip of the $MoTa_xO_y$ layer of the structure according to Comparative Example 2.

EXPERIMENTAL EXAMPLE 4

Measurement of Light Reflectance of Structures Including $MoO_2$ Layers Having Different Thicknesses A Ti layer having a thickness of 200 Å and a Cu layer having 5,000 Å were formed on glass, and a $MoO_2$ layer was formed on the Cu layer. Light reflectance was measured while changing the thickness of the $MoO_2$ layer from 200 Å to 400 Å, to 600 Å, and 700 Å. As a control group, an Al layer having a thickness of 1,000 Å and a Ti/Cu layer with no $MoO_2$ layer were formed.

Figure 30:
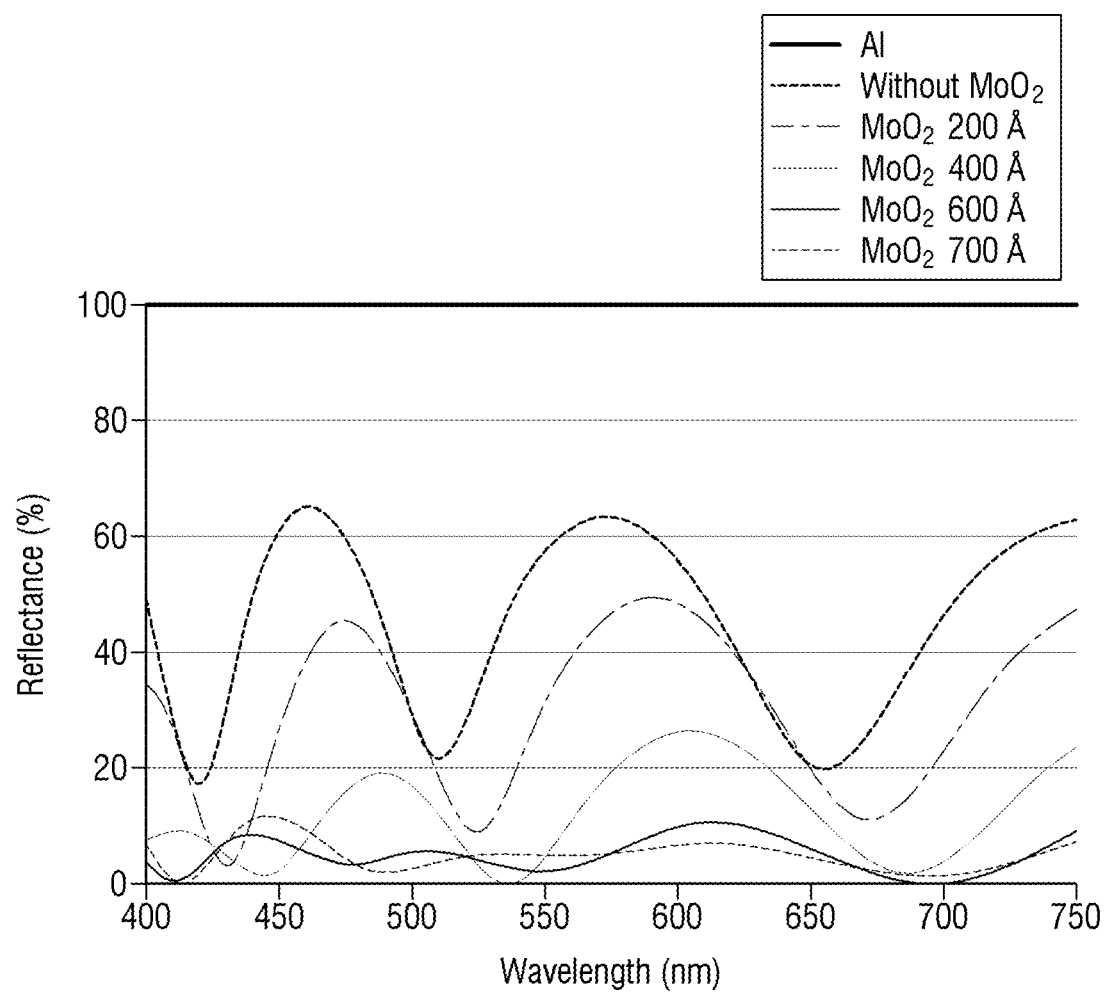
FIG. 30 is a graph showing results of Experimental Example 4.

FIG. 30 shows a light reflectance graph corresponding to the results of Experimental Example 4, particularly, light reflectance measurements (relative to the light reflectance of Al) obtained from samples according to Experimental Example 4, having no $MoO_2$ layer or having a $MoO_2$ thickness of 200 Å, 400 Å, 600 Å, or 700 Å.

Referring to FIG. 30, maximum light reflectance is about 67% when there is no $MoO_2$ layer, and light reflectance can be reduced to some extent by forming a $MoO_2$ layer to a thickness of 200 Å.

Particularly, when the $MoO_2$ layer is formed to a thickness of 400 Å, light reflectance can be considerably reduced to about 50% or lower. Also, when the $MoO_2$ layer is formed to a thickness of 600 Å or 700 Å, light reflectance can be further considerably reduced to about 20% or lower.

That is, the lower limit of the thickness of the $MoO_2$ layer is about 400 Å or 600 Å, which is of critical significance, and light reflectance converges at about 600 Å or greater.

While example embodiments have been described above, modifications and variations can be made without departing from the spirit and scope defined by the appended claims. The described embodiments should be considered in an illustrative sense and not for purposes of limitation.

What is claimed is:

1. A display device comprising:
a base; and
a first wiring layer disposed on the base, the first wiring layer including a first material layer and a second material layer that overlap each other,
wherein a material of the second material layer is different from a material of the first material layer,
wherein the second material layer contains $MoO_x$,
wherein $1.9 \leq x \leq 2.1$, and
wherein the first material layer and the second material layer directly contact each other,
a thickness of the first material layer in a direction perpendicular to the base is greater than a thickness of the second material layer in the direction, and
the thickness of the second material layer is 400 Å or greater.

2. The display device of claim 1, wherein the light reflectance of the first material layer is higher than the light reflectance of the second material layer.

3. The display device of claim 1, wherein
the first wiring layer further includes a third material layer spaced from the second material layer and directly contacting the first material layer,
the first material layer is interposed between the third material layer and the second material layer, and
the electrical conductivity of the first material layer is higher than the electrical conductivity of the second material layer and is higher than the electrical conductivity of the third material layer.

4. The display device of claim 1, wherein
the first wiring layer further includes a third material layer spaced from the second material layer and directly contacting the first material layer,
the first material layer is interposed between the third material layer and the second material layer,
the first material layer and the second material layer directly contact each other,
a thickness of the first material layer in a direction perpendicular to the base is greater than a thickness of the third material layer in the direction, and
a thickness of the second material layer in the direction is greater than the thickness of the third material layer.

5. The display device of claim 1, wherein
the second material layer includes a first portion and a second portion,
the first portion contains the $MoO_x$ and directly contacts the first material layer,
the second portion is disposed on the first portion and contains $MoO_y$,
$x < y$, and
the $MoO_y$ and the $MoO_x$ are connected to each other through chemical bonds.

6. The display device of claim 5, wherein the first portion contains first amorphous molybdenum oxide and consists of only molybdenum atoms and oxygen atoms.

7. The display device of claim 6, wherein
the second portion contains second amorphous molybdenum oxide and consists of only Mo atoms and O atoms, and
y is in a range of 2.9 to 3.1.

8. The display device of claim 5, wherein a thickness of the first portion in a direction perpendicular to the base is greater than a thickness of the second portion in the direction.

9. The display device of claim 5, further comprising:
a passivation layer disposed on the first wiring layer and directly contacts the second portion; and
a pixel electrode disposed on the passivation layer, wherein
the second portion and the passivation layer have a contact hole, and
the pixel electrode directly contacts the first portion through the contact hole.

10. The display device of claim 9, wherein the specific resistance of the first portion is $10^{-4}$ Ωm or less.

11. The display device of claim 1, further comprising:
a second wiring layer disposed between the base and the first wiring layer, insulated from the first wiring layer, and including a fourth material layer and a fifth material layer that overlap each other; and
a semiconductor material layer disposed between the first wiring layer and the second wiring layer,
wherein
the fourth material layer contains the same material as the first material layer, and
the fifth material layer contains the same material as the second material layer.

12. The display device of claim 11, wherein
sides of the second material layer form a first acute angle,
sides of the fifth material layer form a second acute angle, which is smaller than the first acute angle, and
sides of the semiconductor material layer form a third acute angle, which is greater than the first acute angle.

13. The display device of claim 12, wherein
the first wiring layer includes a data line, a source member, and a drain member,
the second wiring layer includes a gate line and a gate member, and
the gate member, the semiconductor material layer, the source member, and the drain member form a thin-film transistor.

14. A wiring substrate comprising:
a base; and
a first wiring layer disposed on the base, the first wiring layer including a first material layer and a second material layer that overlap each other,
wherein a material of the second material layer is different from a material of the first material layer,
wherein the second material layer contains $MoO_x$,
wherein $1.9 \leq x \leq 2.1$, and
wherein the first material layer and the second material layer directly contact each other,
a thickness of the first material layer in a direction perpendicular to the base is greater than a thickness of the second material layer in the direction, and
the thickness of the second material layer is 400 Å or greater.

15. A method of fabricating a wiring substrate, comprising:
sequentially forming a first layer and a second layer on a base, wherein a material of the second layer is different from a material of the first layer;
forming a mask on the second layer; and
forming a first material layer and a second material layer by etching the first layer and the second layer using the mask,
wherein the second material layer contains $MoO_x$,
wherein $1.9 \leq x \leq 2.1$, and
wherein the first material layer and the second material layer directly contact each other,
a thickness of the first material layer in a direction perpendicular to the base is greater than a thickness of the second material layer in the direction, and
the thickness of the second material layer is 400 Å or greater.

16. The method of claim 15, further comprising: between the forming the second layer and the forming the mask, partially oxidizing the second layer.

17. The method of claim 16, wherein
the partially oxidizing the second layer produces a first portion and a second portion,
the first portion contains the $MoO_x$,
the second portion contains $MoO_y$ that has chemical bonds with the $MoO_x$,
$x<y$, and
the method further comprises: after the forming the first portion and the second portion, exposing the first portion by partially removing the second portion.

18. The method of claim 15, wherein
the second layer is formed through sputtering,
the sputtering is performed in an inert gas atmosphere,
a target of the sputtering contains molybdenum oxide, and
the Mo:O composition ratio of the molybdenum oxide contained in the target is in a range of 1:1.9 to 1:2.1.

19. The method of claim 15, wherein
the etching the first layer and the second metal layer is performed using an etchant, and
the concentration of peroxosulfate in the etchant is in a range of 10.0 wt % to 20.0 wt %.

* * * * *